United States Patent [19]

Kirkland et al.

[11] Patent Number: 5,748,846
[45] Date of Patent: May 5, 1998

[54] NEURAL ENGINEERING UTILITY WITH ADAPTIVE ALGORITHMS

[75] Inventors: Larry V. Kirkland, Ogden; Jere D. Wiederholt, Layton, both of Utah

[73] Assignee: The United States of America as represented by the Secretary of the Air Force, Washington, D.C.

[21] Appl. No.: 517,002

[22] Filed: Aug. 18, 1995

[51] Int. Cl.⁶ .................. G06E 1/00; G06E 3/00
[52] U.S. Cl. .................. 395/20; 395/21; 395/22
[58] Field of Search .................. 395/650, 20, 183, 395/12, 154, 161, 1, 10, 21, 50; 364/580, 424

[56] References Cited

U.S. PATENT DOCUMENTS

| | | | |
|---|---|---|---|
| 4,893,815 | 1/1990 | Rowan | 463/47.3 |
| 4,899,052 | 2/1990 | Lindquist | 250/342 |
| 5,195,095 | 3/1993 | Shah | 395/183.02 |
| 5,197,127 | 3/1993 | Waclawsky et al. | 395/200 |
| 5,214,653 | 5/1993 | Elliott, Jr. et al. | 395/183.02 |
| 5,239,547 | 8/1993 | Tomiyama et al. | 395/183.02 |
| 5,317,725 | 5/1994 | Smith et al. | 395/183.03 |
| 5,339,074 | 8/1994 | Shindley et al. | 340/825.31 |
| 5,544,308 | 8/1996 | Giordano et al. | 395/183.02 |

*Primary Examiner*—Tariq R. Hafiz
*Attorney, Agent, or Firm*—William G. Auton

[57] ABSTRACT

Neural Engineering Utility With Adaptive Algorithms (NEUWAA) is an artificial intelligence system for Automatic Test Equipment (ATE) which integrates various technologies in an adaptive fault-detection environment. Various technologies, other than normal ATE stimulus/reaction, including Infrared, X-ray, RF detection, etc. perceive nonvisible information of current flow and circuit activity which can significantly enhance the technician's perception of defective components. The system includes ATE adaptive algorithms to streamline test sequences and diagnostics. NEUWAA provides active schematics and active Unit Under Test (UUT) layouts. NEUWAA consists of diagnostic algorithms for specific pre-test information, specific test selection information, and specific diagnostic information. NEUWAA is a WINDOWS based utility. NEUWAA interacts with other Windows & DOS applications to provide and interoperate in a client server software environment. NEUWAA is a stand alone product which has no dependence on other technologies like Infrared, X-ray, RF, etc. NEUWAA does provide a link and algorithmic software for information exchange between these technologies.

8 Claims, 20 Drawing Sheets

Microfiche Appendix Included
(9 Microfiche, 500 Pages)

FIG. 5B

TESTS LIKELY TO FAIL, GENERAL

Toolbar: ACTIVATE | CLEAR | RESTORE | REMOVE | X-REF | RETURN | PRINT | EXE-TPS

| TEST | TIMES FAILED | PROBABILITY |
|------|--------------|-------------|
| 100  | 7            | 17.500 %    |
| 8    | 6            | 15.000 %    |
| 88   | 4            | 10.000 %    |
| 50   | 4            | 10.000 %    |
| 40   | 3            | 07.500 %    |
| 6    | 3            | 07.500 %    |
| 3    | 3            | 07.500 %    |
| 4    | 3            | 07.500 %    |
| 99   | 2            | 05.000 %    |

SET TESTS AND SORT: 3, 4, 6

VIDEO

FIG. 6A

PROBABLE DEFECTIVE COMPONENTS, "GENERAL"

| PART | TIMES FAILED | PROBABILITY |
|------|--------------|-------------|
|      |              |             |

A - ACTIVATE | C - CLEAR | XREF | XFRET | PRINT RESULTS | R - RETURN TO PROBLEM SET

FIG. 14B

| ACTIVATE | CLEAR | RESTORE | REMOVE | X-REF | RETURN | PRINT | EXE-TPS |

EXECUTE PROBABLE TESTS TO FAIL, BASED ON "REASON FOR REPAIR"

RELATED TESTS
- 99
- 8

PROBABLE TEST — 88

TIMES — 4

DEFECTIVE COMPONENTS & PROBABILITY OF FAILURE
- U8    40.000 %
- U1    40.000 %
- U7    20.000 %

SELECT REASON FOR REPAIR
- STEP 776688
- STEP 223344
- STEP 437890
- STEP 550096
- 333333

VIDEO

FIG. 14C

| ACTIVATE | CLEAR | RESTORE | REMOVE | X-REF | RETURN | PRINT | EXE-TPS |

EXECUTE PROBABLE TESTS TO FAIL, BASED ON "SUSPECTED DEFECTIVE COMPONENTS"

| TEST | PART FAILURES | TOTAL FAILURES |
|---|---|---|
| 8 | 2 | 6 |
| 88 | 2 | 4 |
| 6 | 2 | 3 |
| 40 | 1 | 3 |

SELECT A SUSPECTED DEFECTIVE PART
- U5
- U1
- U7

UNWANTED TESTS

VIDEO

FIG. 15A

IDENTIFY COMPONENT FAILURE PROBABILITIES

PART TIMES FAILED PROBABILITY

| | | |
|---|---|---|
| RELAY | - 3 - | 30.000 % |
| ELGAR | - 3 - | 30.000 % |
| DMM- | 2 - | 20.000 % |
| SWITCH MATRIX | - 1 - | 10.000 |
| 486 PC | - 1 - | 10.000 % |

HELP

A - ACTIVATE | C - CLEAR | XREF | XFRET | PRINT RESULTS | R - RETURN TO PREDICTIVE DIAG

FIG. 15B

ACTIVATE | CLEAR | RESTORE | REMOVE | X-REF | RETURN | PRINT | EXE-TPS

IDENTIFY COMPONENT FAILURE PROBABILITIES

PART TIMES FAILED PROBABILITY

| | | |
|---|---|---|
| U5 - | 10 - | 19.608 % |
| U1 - | 9 - | 17.647 % |
| U7 - | 6 - | 11.765 % |
| U8 - | 5 - | 09.804 % |
| U54- | 3 - | 05.882 % |
| U23- | 3 - | 05.882 % |

DEGRADATION RATE

VIDEO

NEURAL ENGINEERING UTILITY WITH ADAPTIVE ALGORITHMS

STATEMENT OF GOVERNMENT INTEREST

The invention described herein may be manufactured and used by or for the Government for governmental purposes without the payment of any royalty thereon.

REFERENCE TO MICROFICHE APPENDIX

Reference is made to the microfiche appendix which contains 500 pages of the NEUWAA source code on 9 microfiche slides.

BACKGROUND OF THE INVENTION

The present invention relates generally to artificial intelligence systems, and more specifically the invention pertains to a diagnostic system that has been given the same Neural Engineering Utility With Adaptive Algorithms (NEUWAA).

NEUWAA is an artificial intelligence system for Automatic Test Equipment (ATE) which integrates various technologies in an adaptive fault-detection environment.

Traditional test programs are sequential, non-interactive, lack facility to weigh multiple information sources, and are unable to adapt, even when erroneous software prognoses can be clearly identified. Interoperability is not supported. These programs also lack capability for test program maintenance and development, which must usually be done on a different platform by a test program engineer.

The task of providing a machine-based intelligence system for automatic test equipment, which integrates various technologies in an adaptive fault-detection environment is alleviated, to some extent by the systems described in the following U.S. patents, the disclosures of which are specifically incorporated herein by reference:

U.S. Pat. No. 5,317,725 issued to Smith et al;

U.S. Pat. No. 5,239,547 issued to Tomiyama et al;

U.S. Pat. No. 5,214,653 issued to Elliot Jr. et al;

U.S. Pat. No. 5,197,127 issued to Waclawsky et al; and

U.S. Pat. No. 5,195,095 issued to Shah.

While the above-cited references are instructive, none of the cited patents disclose an artificial intelligence system for automatic test equipment which integrates various technologies in an adaptive fault-detection environment. The patent to Shah discloses an algorithm for identifying tests to perform for fault isolation. The patent to Elliott Jr. et al discloses artificial intelligent software for finding faults in a target system. The remaining patents are of similar interest.

SUMMARY OF THE INVENTION

The present invention is a system for using diagnostic software that has been given the name Neural Engineering Utility With Adaptive Algorithms (NEUWAA). NEUWAA is an artificial intelligence system for Automatic Test Equipment (ATE) which integrates various technologies in an adaptive fault-detection environment. Various technologies, other than normal ATE stimulus/reaction, including Infrared, X-ray, RF detection, etc. perceive non-visible information of current flow and circuit activity which can significantly enhance the technician's perception of defective components.

The system includes ATE adaptive algorithms to streamline test sequences and diagnostics. NEUWAA provides active schematics and active Unit Under Test (UUT) layouts. NEUWAA consists of diagnostic algorithms for specific pre-test information, specific test selection information, and specific diagnostic information. NEUWAA is a WINDOWS based utility. NEUWAA interacts with other Windows & DOS applications to provide and interoperate in a client server software environment. NEUWAA is a stand alone product which has no dependence on other technologies like Infrared, X-ray, RF, etc. NEUWAA does provide a link and algorithmic software for information exchange between these technologies.

It is an object of the present invention to streamline test sequences and diagnostics.

It is another object of the present invention to make diagnostic decisions using non-visible information of current flow and circuit activity which can significantly enhance the technician's perception of defective components.

These objects together with other objects, features and advantages of the invention will become more readily apparent from the following detailed description when taken in conjunction with the accompanying drawings wherein like elements are given like reference numerals throughout.

DESCRIPTION OF THE DRAWINGS

FIG. 5B is the result screen for the test option of FIG. 5A;

FIG. 6A is the NEUWAA icon screen for the general identification of probable defective components;

FIG. 14B is an example of a screen for the option of FIG. 14A with reasons for repair listed;

FIG. 14C is an example of a results screen for the option of FIG. 14A;

FIG. 15A is the NEUWAA icon screen for identifying component failure probabilities;

FIG. 15B is an example of a result screen for the option of FIG. 15A;

DETAILED DESCRIPTION OF THE PREFERRED EMBODIMENT

The present invention includes an artificial intelligence system for automatic test equipment which integrates various technologies in an adaptive fault-detection environment. Various technologies, other than normal ATE stimulus/reaction, including Infrared, X-RAY, RF detection, etc. perceive non-visible information of current flow and circuit activity which can significantly enhance the technician's perception of defective components. The system includes ATE Adaptive Algorithms to streamline test sequences and diagnostics. NEUWAA provides active schematics and active UUT Layouts. NEUWAA consists of diagnostic algorithms for specific pre-test information, specific test selection information, and specific diagnostic information. NEUWAA is a WINDOWS-based utility. NEUWAA interacts with other WINDOWS & DOS applications to provide an interoperable client-server software environment. NEUWAA is a stand-alone product which has no dependence on other technologies like Infrared, X-ray, RF, etc., however it does provide a link and algorithmic software for information exchange between these technologies.

Figure 1:
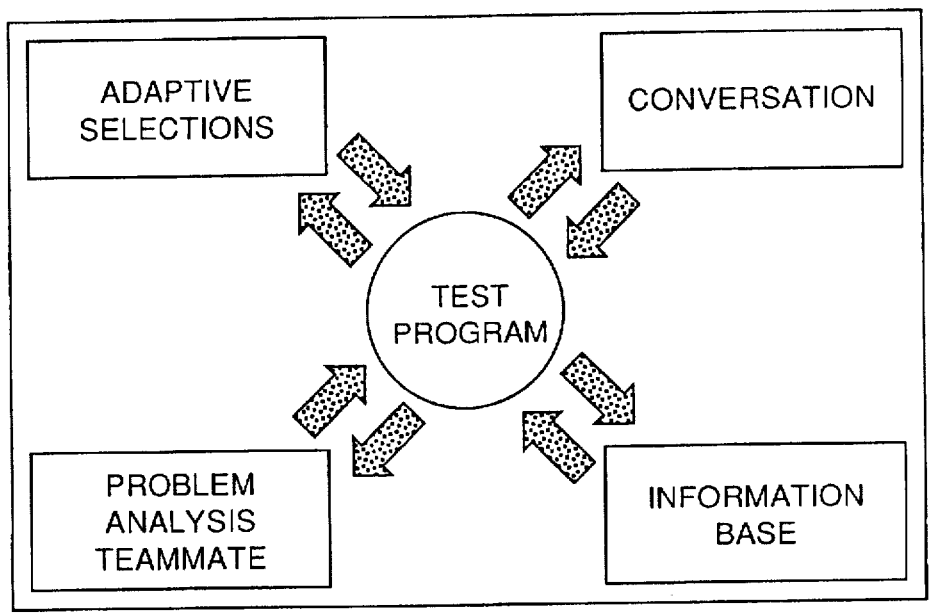
FIGS. 1 and 2 are illustrations of the use of the present invention as a diagnostic and fault detection system.

The reader's attention is now directed towards FIG. 1 which is an illustration of an application of the present invention. More specifically, when the source code of the microfiche appendix is loaded into any WINDOWS based computer test system, the result is an artificial intelligence system for automatic test equipment for adaptive fault detection of conversation and communication systems, information data bases and other adaptive selections and problem analysis systems. The objective of the present invention is to provide special testing and diagnostic tools that have artificial intelligence and universal applications.

Figure 2:
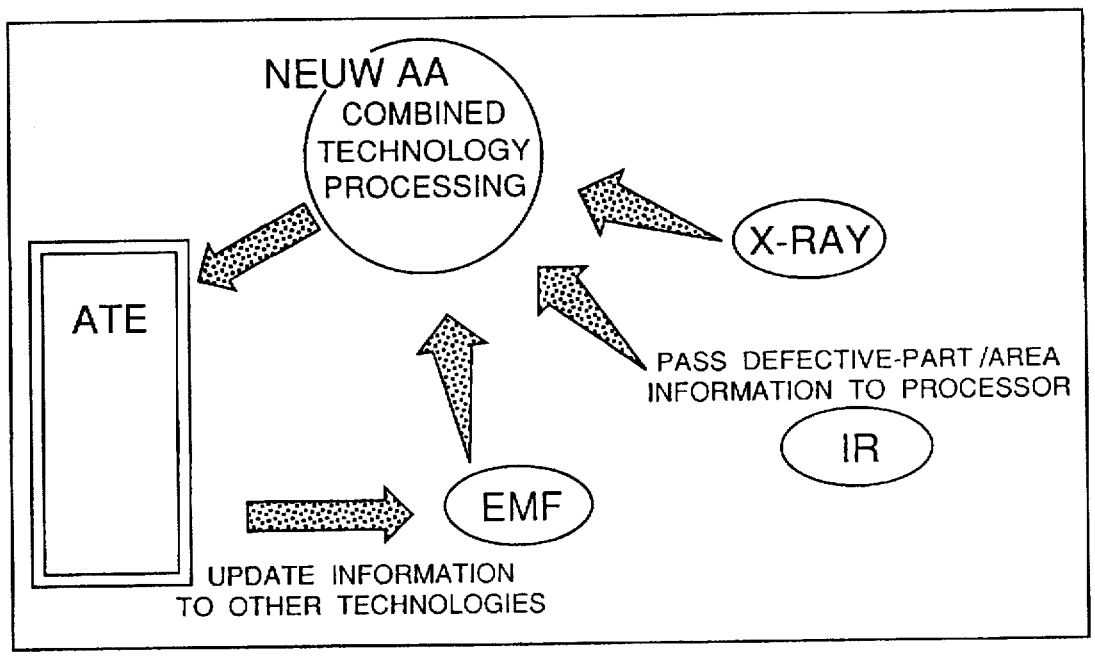

FIG. 2 is an illustration of how the present invention can help automatic test equipment (ATE) support such diverse technologies as X-Ray, infrared (IR) and EMF systems. NEUWAA provides cross-referenced diagnostic information for Test/Diagnosis of hardware outputs for the automatic test equipment as described below.

Figure 3A:
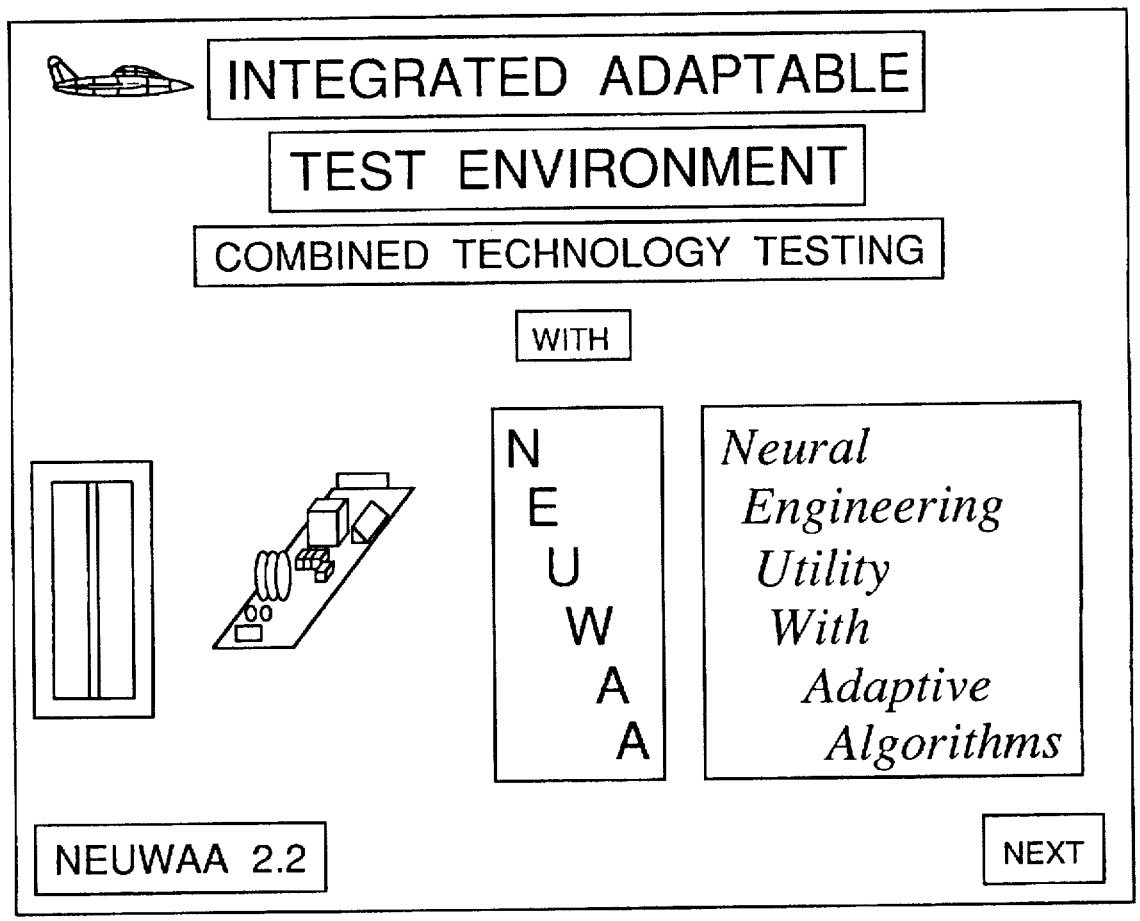
FIG. 3A is the NEUWAA 2.2 main icon screen.

When the source code is loaded into a DOS or WINDOWS based computer system that supports automatic test equipment system of FIG. 2, the computer screen will initially show the display illustrated in FIG. 3A. Users of the system are prompted by subsequent displays in an interoperable client-server environment to perform diagnostic, test, and fault detection services.

Figure 3B:
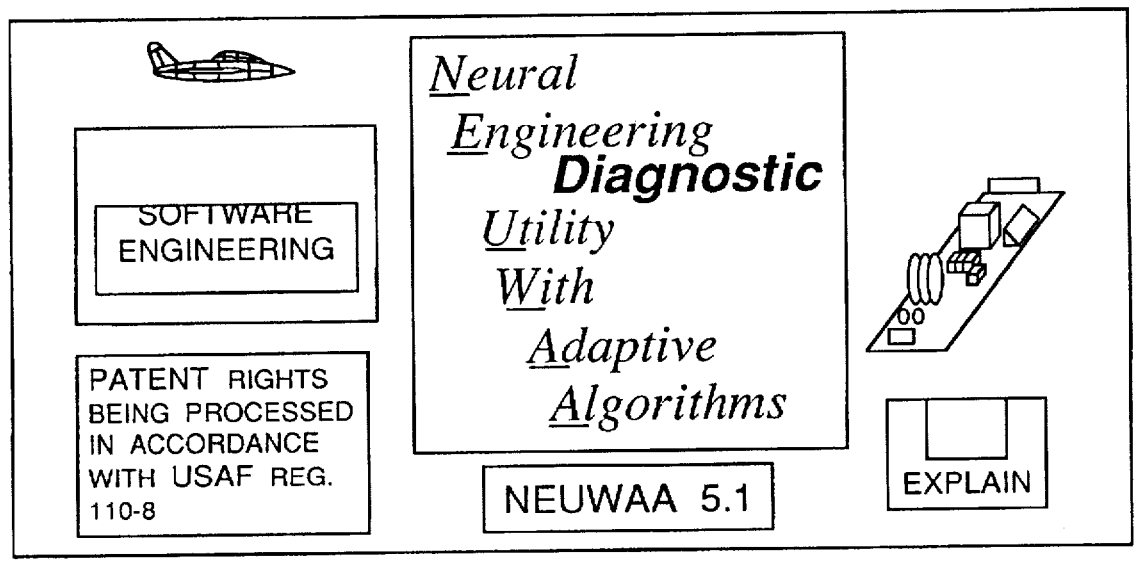
FIG. 3B is the NEUWAA 5.1 main icon screen.
Figure 3C:
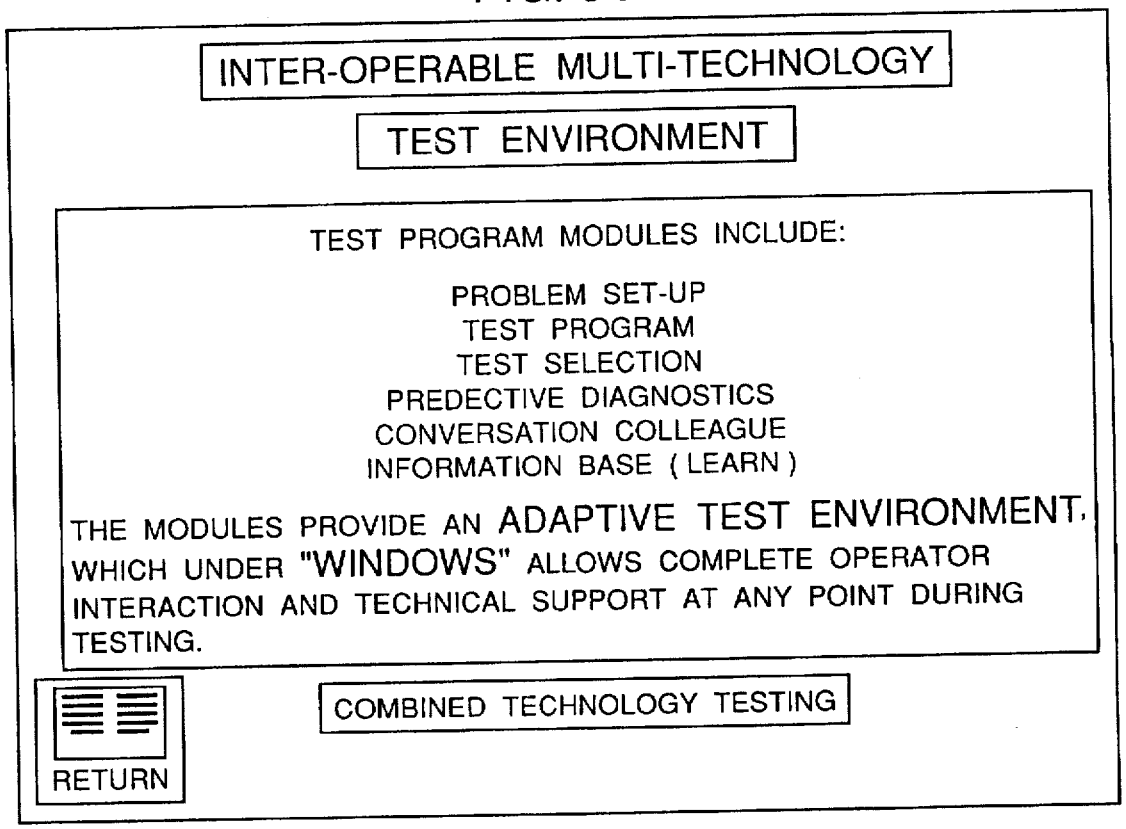
FIG. 3C is the combined technology testing icon screen.
Figure 4A:
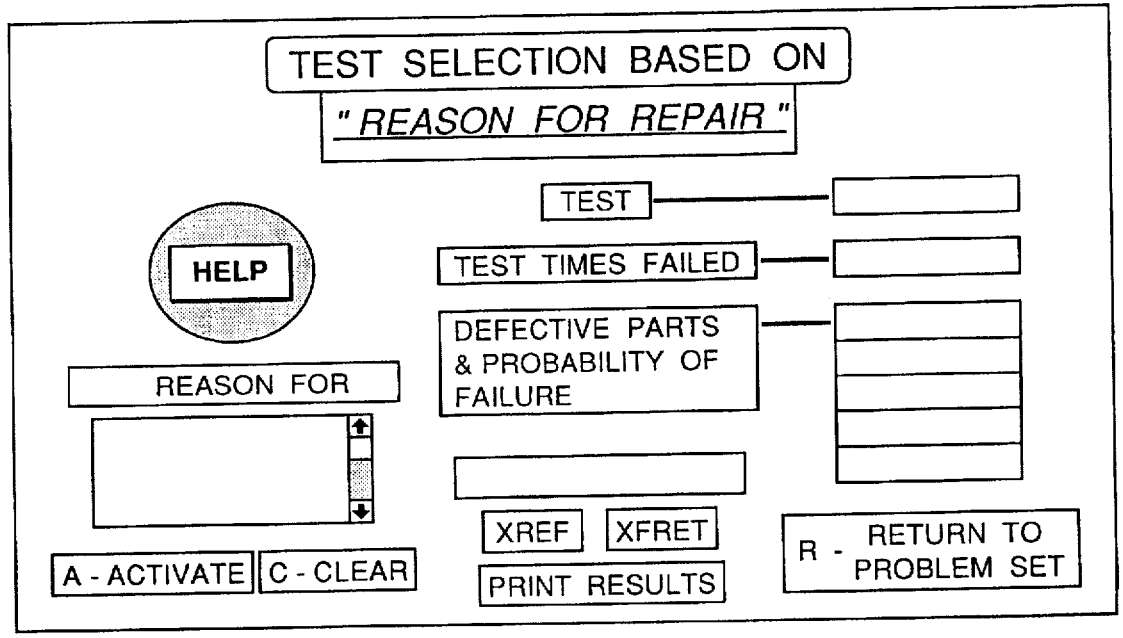
FIG. 4A is the main icon for test selection based upon reason for repair.
Figure 4B:
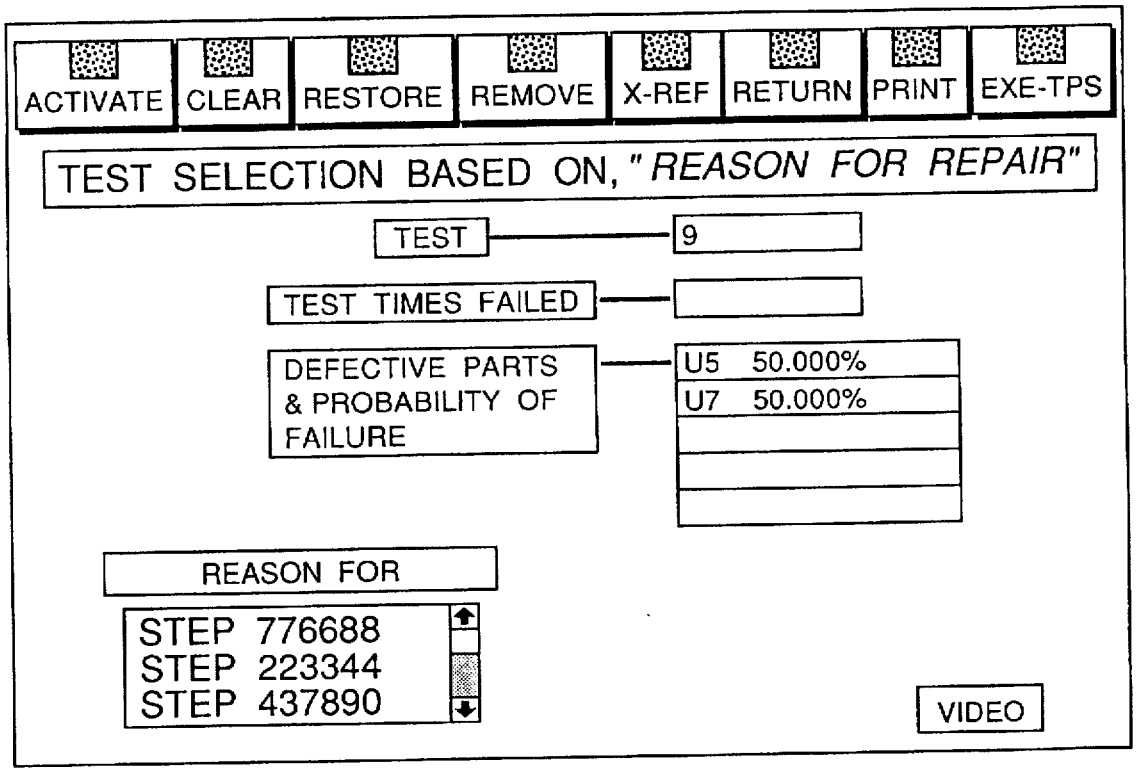
FIG. 4B is result screen for the test selection option of FIG. 4A.
Figure 5A:
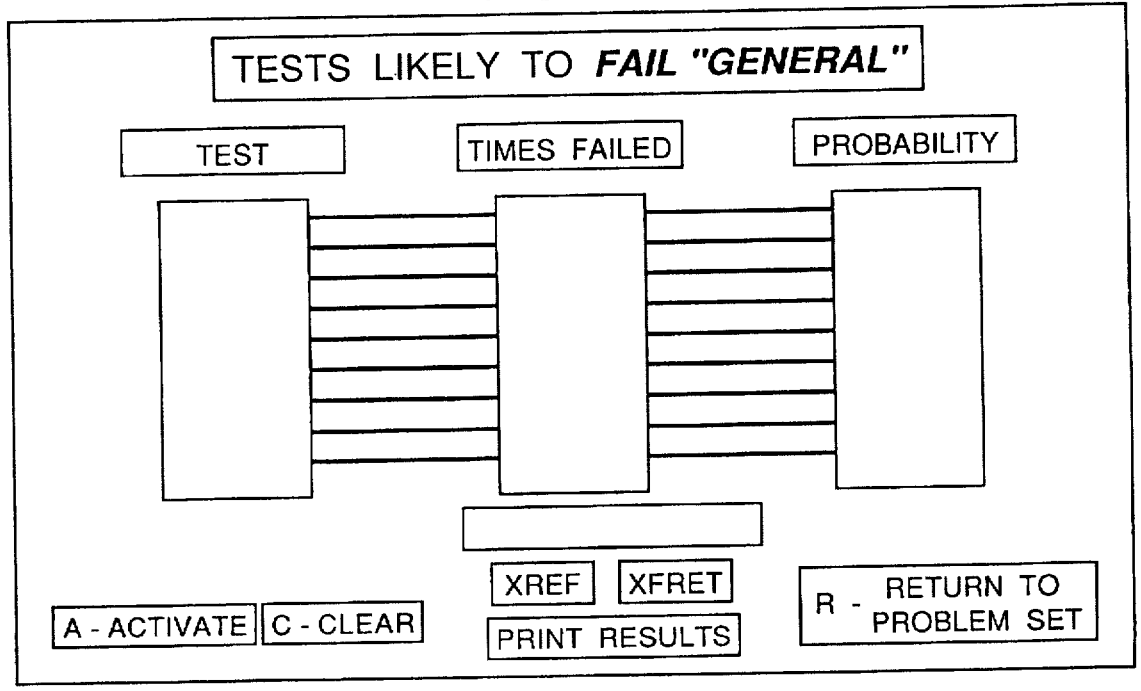
FIG. 5A is the main screen for general tests likely to fail.

FIG. 3A is the NEUWAA 2.2 main icon screen;

FIG. 3B is the NEUWAA 5.1 main icon screen;

FIG. 3C is the combined technology testing icon screen;

FIG. 4A is the main icon for test selection based upon reason for repair;

FIG. 4B is result screen for the test selection option of FIG. 4A;

FIG. 5A is the main screen for general tests likely to fail;

FIG. 5B is the result screen for the test option of FIG. 5A.

Although NEUWAA integrates other technologies to cross-reference with the ATE, NEUWAA essentially is a stand alone ATE product. There is no dependence on other technologies like IR, X-RAY, etc.

Table 1 presented below lists the characteristics users of the NEUWAA system will encounter.

TABLE 1
NEUWAA PARTICULARS:
1. Active Schematics/Layouts
2. Windows
    a. Icons, Buttons, Menus, etc.
    b. Control Panels
    c. Synthetic Test Devices
    d. Active diagrams
3. State-of-the-art Technology for ATE
4. Speech & Audio
5. RF Identification
6. On-the-Fly Adaptation
7. Integrated Technologies (there if you want them)
    a. X-rays
    b. Infrared Detection
    c. EMF
    d. Electro-Optical Imaging
    e. Vision
8. Open Architecture & Interoperability
    a. Standard ASCII ontology
9. Interface to off-the-shelf utilities
10. Object-Oriented
11. Graphical (Colors & Character Control)
    a. Visual
    b. Virtual Realism
12. Dynamic Information Base Size
SUBJECT: NEUWAA (NEURAL ENGINEERING UTILITY WITH ADAPTIVE ALGORITHMS)

1. NEUWAA is a project to integrate State-of-the-Art technology into Automatic Test Equipment.
    a. NEUWAA provides the link to other software packages.
    b. NEUWAA provides ADAPTATION for the ATE test sequences & Diagnostics. (Artificial Intelligence)
    c. NEUWAA cross-references information from all sensors then provides appropriate fault determination data.
2. NEUWAA combines technologies to provide an Integrated Adaptive Test Environment: (provides a link and knowledge processing to other technologies to cross-reference with the ATE to aid the diagnostic process.
  a. Infrared
  b. EMF
  c. X-Rays
  d. Electro-optical effects
3. PC-based:
  a. Off-the-shelf operating systems provide a high performance platform for ATE.
  b. Personal Computers provide versatility with their high speed memory manageable open systems.
4. Inter-operabilty:
  a. NEUWAA is an open architecture environment which communicates with and integrates other software packages.
  b. NEUWAA is one of the software packages which DARPA (ARPA) is using to set a standard ontology for Sensor-Based Systems.
  c. AIRCRAFT/LOGISTICS Data
  d. Knowledge-Bases
5. Key elements:
  a. Graphical (Colors & Character Control)
    1. Visual
    2. Virtual Realism.
  b. WINDOWS
    1. Icons, Buttons, Menus
    2. Control Panels
    3. Synthetic Test Devices
  c. Active Schematics & Layouts
  d. On-The-Fly Adaptation
    1. Testing processes change On-the-Fly to improve the repair process.
  e. Combined Technologies: (NEUWAA is the co-ordination center for all technologies, NEUWAA integrates other diagnostic technologies into ATE to guide the ATE test sequences & aid in fault determination)
    1. X-Rays
    2. Infrared Detection
    3. Electro-Magnetic Detection
    4. RF technology
    5. Electro-Optical Magnetic Imaging
    6. Sound (Vibration)
  f. Open Architecture
6. Speech & Audio:
  a. Provide operator verbal command & control.
  b. Machine-based messages to the operator.
7. Vision (Computer):
  a. UUT examination
8. Dynamic Information Base size:
  a. Memory is managed so information is stored in actual required space.
  b. Parameters change in the information base, size is controlled.
9. Interfaces to off-the-shelf Utilities
10. Object Oriented
11. NEUWAA provides an ADAPTIVE TEST ENVIRONMENT, which under "WINDOWS" allows complete operator interaction and technical support at any point during testing.
12. NEUWAA works with the ATE to update other technologies or vice versa.
NEUWAA remarks:
1. NEUWAA can open other applications and control them.
2. Running multiple applications on ATE, and switching between them creating an integrated work environment.
3. Transferring data between standard DOS applications as well as other window applications for complete interoperability.
4. Providing an open-architecture in a graphical and virtual operating environment.
5. Providing audio with voice recognition and speaker response.
6. NEUWAA has a Media Control Interface so other devices (Audio,RF Reader,etc.) can be controlled. A set of commands for the WINDOWS environment controls the instruments.
7. Graphical user interfaces with windows, menus, dialog boxes, and graphic controls.
8. Full featured object-oriented programming environment.
9. Appealing color screens and each object has its own set of built-in behaviors.
10. Fields can be scrolled so much more information can be presented in a smaller window.
11. WINDOWS software controls memory management, screen imaging and other related issues so problems can not crop up.
12. Users can easily learn NEUWAA by just using it, the mouse and highlighted test environment is easy to follow.
13. True machine intelligence can be achieved through the multimedia environment.
14. Parameter bases are standard ASCII characters, and are accessible by standard software.
15. Using Dynamic Link Libraries(DLL) are used to share code and resources. Tasks not available in a specific application can be performed by a DLL.
16. Using Dynamic Data Exchange(DDE) for communication, allowing applications to exchange data with and execute commands.

OLD WAY
Sequential
Non-interactive
Slow
Non-controllable
unique operating systems
graphically dead
non-interoperable
non adaptive
not user friendly
no dialogue
sequential fault diagnosis
non changable cause of failure
NEUWAA
Dynamic Test Program Control
interactive
top speed (real-time)
automated data collection
DOS
completely interoperable/multi-language
highlighted visual images with special techniques
adapts to specific UUT
super user friendly (top-speed, conversation) with special visual effects
UUT images with dialogue
several fault diagnostic options plus flexibility to sequence
cause of failure dependent on actual defective parts encountered during test
Proof-of-Concept
Standard Interface (IEEE)
Adaptive Machine-based Intelligence
Off-the-shelf operating system (i.e. DOS, UNIX, WINDOWS and TOOLBOOK) provide a high-performance platform for machine-intelligent implementation of integrated technologies for Automatic Test Equipment. Open architectures in an integrated technology environment permit the integration of multiple information sources for diagnostic evaluation of a Unit Under Test (UUT). Intelligent software/hardware provide dynamic Test Program control, real-time interactivity, interoperability multiple languages, highlighted visual images and other user-friendly special visual effects, graphics, image processing, adaptivity, conversation, and automatic data collection. Integrated Technology provides a system whereby sensors other than ATE embedded devices (IR, X-Rays, etc) are coupled into the ATE/Test Program to enhance the diagnostic process and streamline the repair cycle.

The system's Adaptive Algorithms for pre-test, test selection, predictive diagnostics are available for multiple cross-referencing. The Adaptive Algorithms provide a cross-reference of information during ATE testing. The cross-referenced information allows the user to decide on various test/diagnostic schemes.

There are various technologies which can provide UUT functional information other than the standard electronic stimulus/response of the Automatic Test Equipment. Using information from other technologies enhances the UUT diagnostic evaluation. Opinions derived by other technologies about the UUT functionality are integrated together to form an optimal test/repair strategy. Communications between systems is achieved by a standard ontology of common terms to represent sensor and sensor-based signals in Knowledge-based Learning Systems. Ontology provides a lexicon of common terms, providing the users with a common dictionary of standard labels and units which have a precise, well-defined meaning, independent of the internal or individual processing system. The Sensor-based Ontology is an ATE-specific ontology which provides for interoperability between different software packages, testers, sensors, and Instruments on a Card (IAC). Essentially, interoperability is the ability to communicate between software packages and understand what is said.

Emergent concepts are used whenever possible to optimally perform tasks. Everything in the universe is governed by chaos in one way or another. Chaos is sometimes perceived as an erratic derivation in flow, however this is generally not the case. There is more than one way to get from point A to point B. The optimal way is not always the cut and dry solution that so many systems tend to conclude but rather can be a varied way with unknown factors having a greater influence on direction. Concepts like Genetic Algorithms, Lindenmayer systems, and Cellular Automata are used to generate, maintain and optimize operational processes.

ATE operating systems should be open so as to allow integration of other sensors and provide information exchange about UUT failures. Open Architectures keep the door open for technology integration. State-of-the Art software/hardware can be readily integrated in an open system without change to the existing system. No longer can the technical world isolate themselves into a never ending system overhaul requirement every time a system needs to be upgraded.

Mingling technologies gives the repair technician a much broader window of information about the UUT. Giving the technician more information about the functionality of the UUT is not like committing the unforgivable sin. The more information operators are given, the more they will understand the UUT and begin to equate specific characteristics about the UUT, thus enhancing their ability to perform repair.

This combined technology system provides the tools needed for repair process improvements and operator support. Closed systems which can not communicate with the outside world hinder technology breakthroughs and blind the technician to other pertinent information. Depriving the technician of information to aid in the test/diagnosis of a UUT is counter-productive to a cost effective quality work environment. For example, the Infrared system can detect heating problems and inform the user to shut down power before UUT damage can occur. An intellectual challenge of the highest order is to continue to develop and integrate all technologies which can be beneficial to the test/diagnosis world. The intent is to open up the ATE systems and provide an avenue for all technology integration and interoperability.

NEUWAA (new way) stands for the "Neural Engineering Utility with Adaptive Algorithms". NEUWAA acts as a meta-processor for a test program, creating an adaptive test program with man/machine interaction including conversation. NEUWAAs' "Problem Analysis Teammate" provides highlighted visual images with dialogue and guided-probe sequences & diagnosis for interactive fault-isolation. NEUWAA employs RF technology for unit under test identification. Operators are provided a complete menu driven test and repair window which allows selectable pre-test options, adaptive test selection options, predictive diagnostic options and conversation options to streamline the testing sequence. NEUWAA contains advanced emergent concepts, as applicable including neural networks, genetic algorithms, Lindenmayer systems, cellular automata etc. in order to efficiently generate, maintain, and optimize operational processes. NEUWAA provides access to all test aids like math and graph packages which highlight key elements of historical data and provide failure modeling capacity. NEUWAA is a software utility that provides state-of-the-art technology for the test program.

NEUWAA is an Adaptive Machine-based Intelligence package used on A.T.E. to control the test program and provide high-speed accurate fault diagnosis. NEUWAA provides State-of-the-art software and hardware for A.T.E. and the test program. NEUWAA contains advanced, as applicable, emergent concepts including neural networks, genetic algorithms, Lindenmayer systems, cellular automata, etc. order efficiently generate, maintain, and optimize operational processes.

Test program operators are provided a complete menu driven test and repair WINDOWS which allow selectable pre-test, adaptive test selection, predictive/adaptive diagnostics, and conversation options to streamline the test sequence. NEUWAA provides an interface to various test aids which can be connected to the A.T.E. (i.e. thermal imaging). The human/machine interface provided by NEUWAA is WINDOWS in order to optimize the user's test environment by providing State-of-the-art techniques with special visual effects and super-friendly top-speed interaction.

Conversation provided by NEUWAA is a link to other technologies and various test aids. NEUWAA provides highlighted visual images with dialogue of the Unit Under Test for interactive fault-isolation including guided-probe sequences derived by NEUWAA, to streamline fault/diagnosis. NEUWAA provides menu driven options for test sequences and fault determination plus allows the operators to build their own special test routines. NEUWAA is inter-operable with all standard ASCII based software systems, and all data elements will be in an inter-operable format.

Table 2 is a list of the pre-test options selectable by users of the NEUWAA system. As indicated in Table 2, the user can select one of six pre-test options. If option number 1 is selected the user will see the computer display of FIG. 4A.

FIGS. 5A through 9 are illustrations of subsequent computer displays as further options are selected.

Figure 6B:
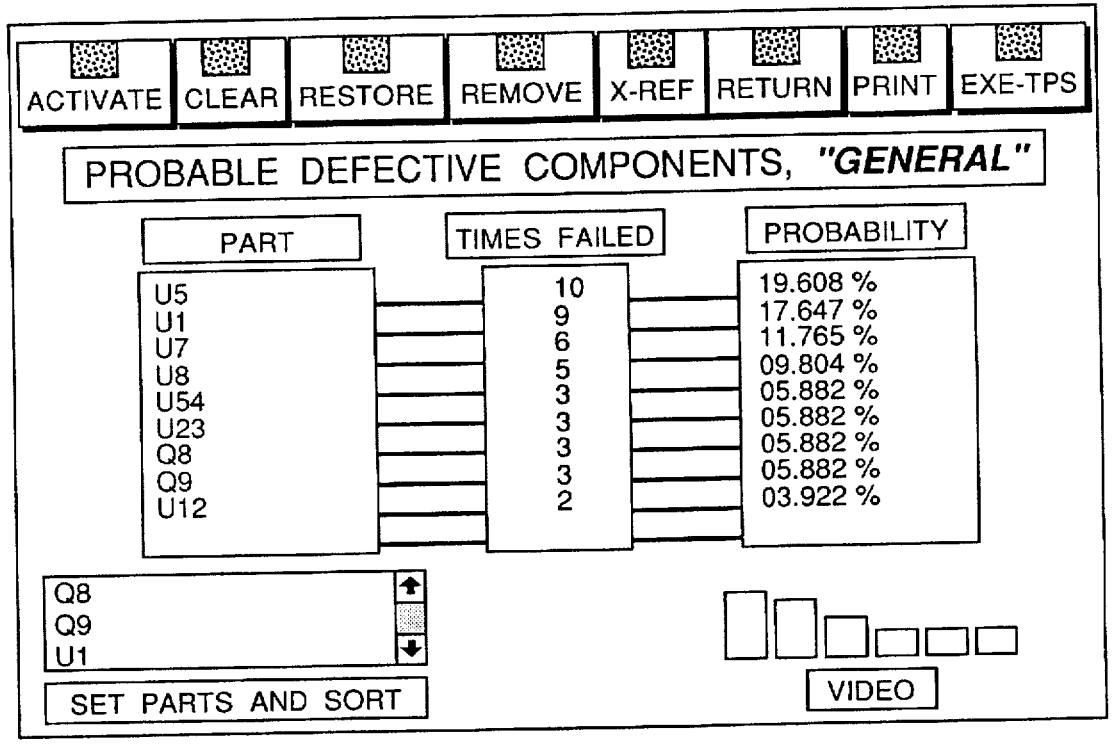
FIG. 6B is an example of a result screen for the option of FIG. 6A.
Figure 7A:
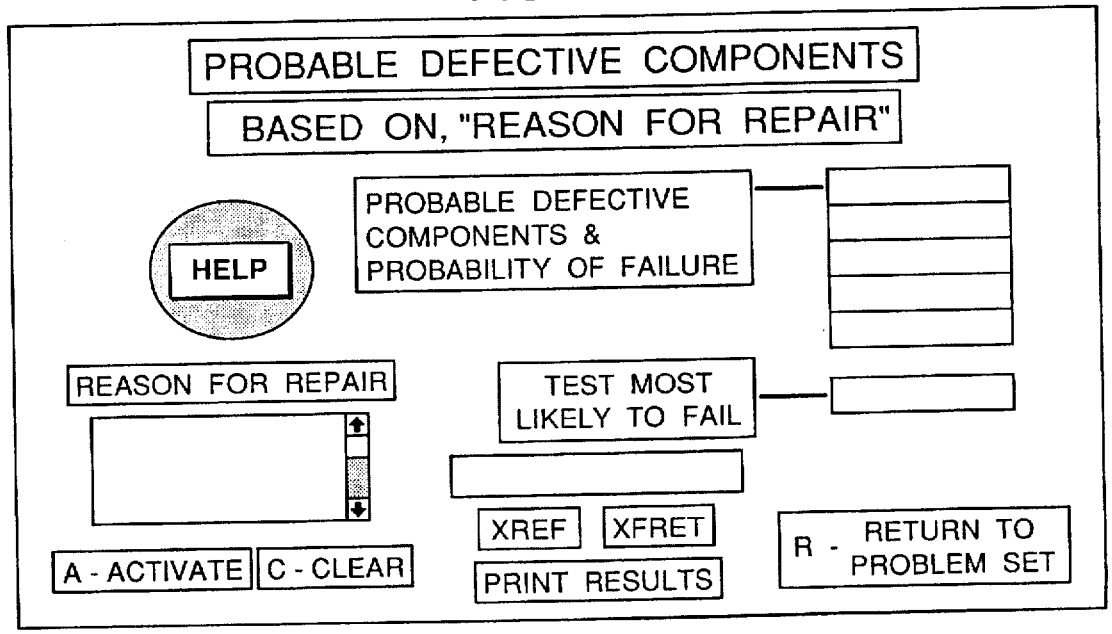
FIG. 7A is the NEUWAA icon screen for identification of probable defective components based upon reason for repair.
Figure 7B:
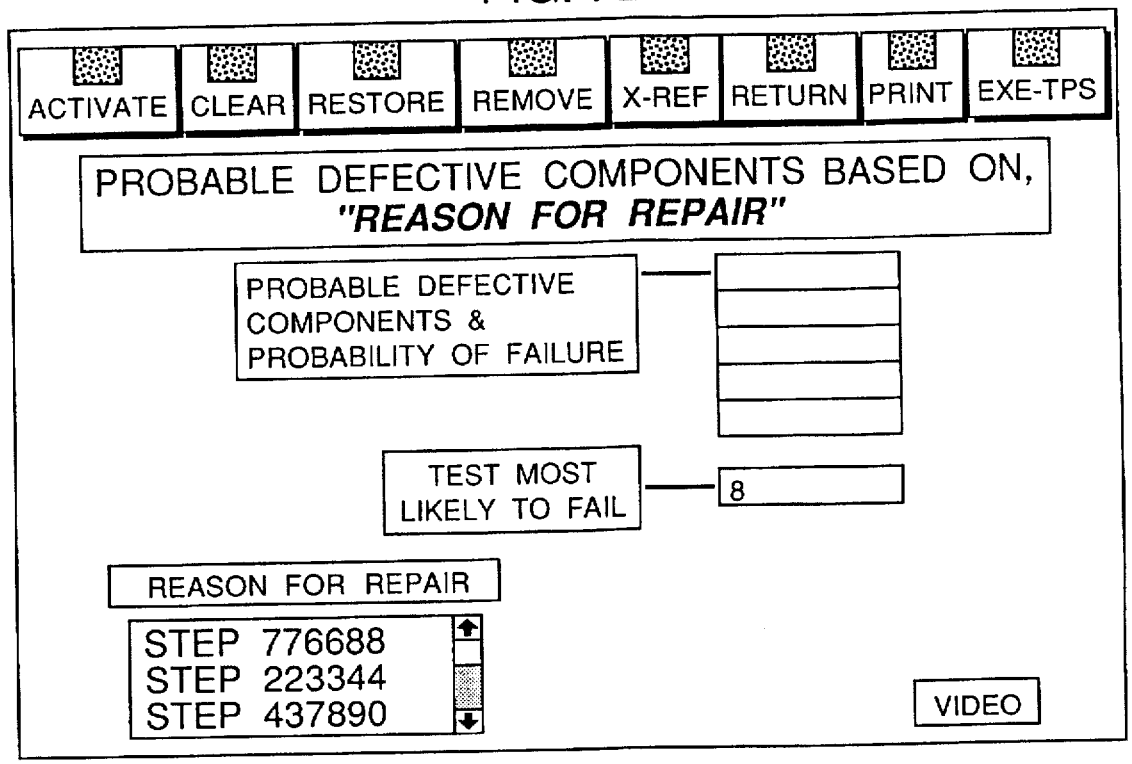
FIG. 7B is an example of a result screen for the option of FIG. 7A.

FIG. 6A is the NEUWAA icon screen for the general identification of probable defective components;

FIG. 6B is an example of a result screen for the option of FIG. 6A;

FIG. 7A is the NEUWAA icon screen for identification of probable defective components based upon reason for repair;

FIG. 7B is an example of a result screen for the option of FIG. 7A.

Figure 8A:
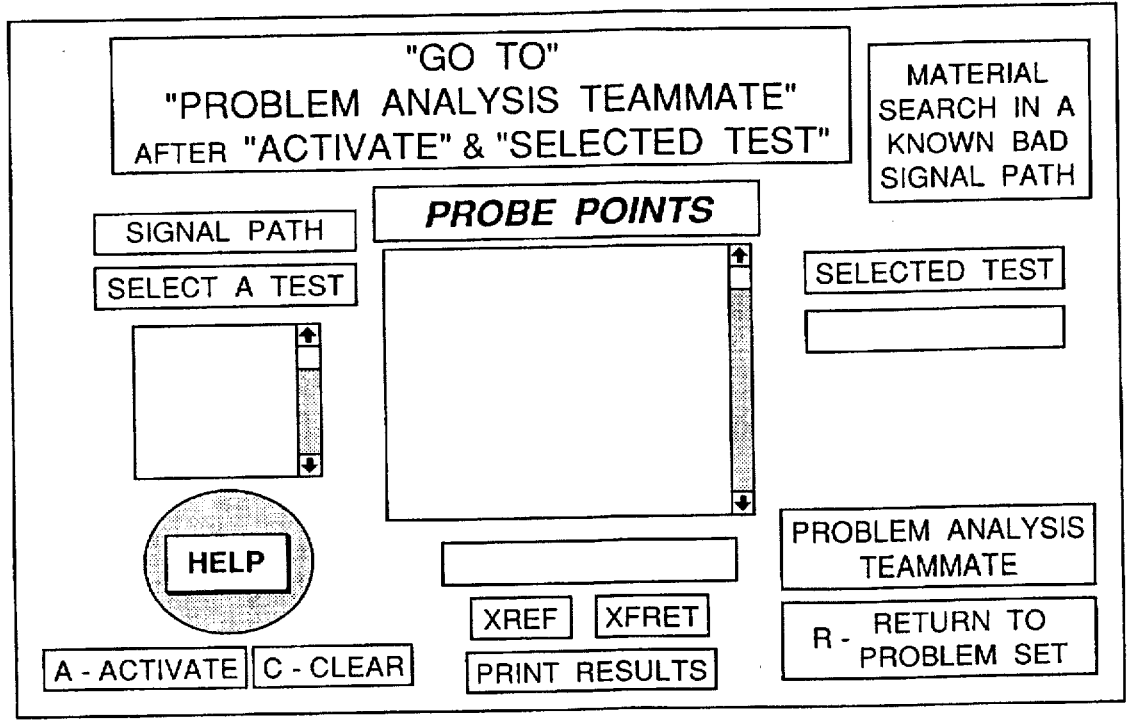
FIG. 8A is the NEUWAA icon screen for the "Go to" and "Probable Analysis Team mate" options.
Figure 8B:
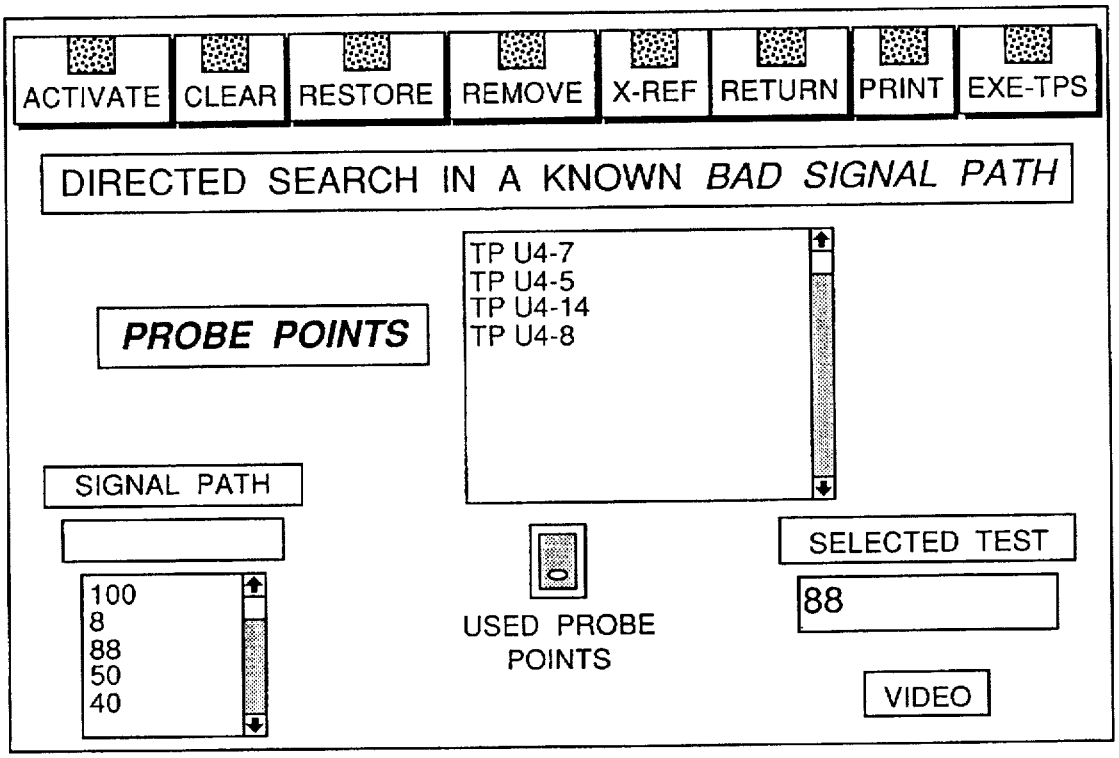
FIG. 8B is a result screen example for a search in a known bad signal path.
Figure 9A:
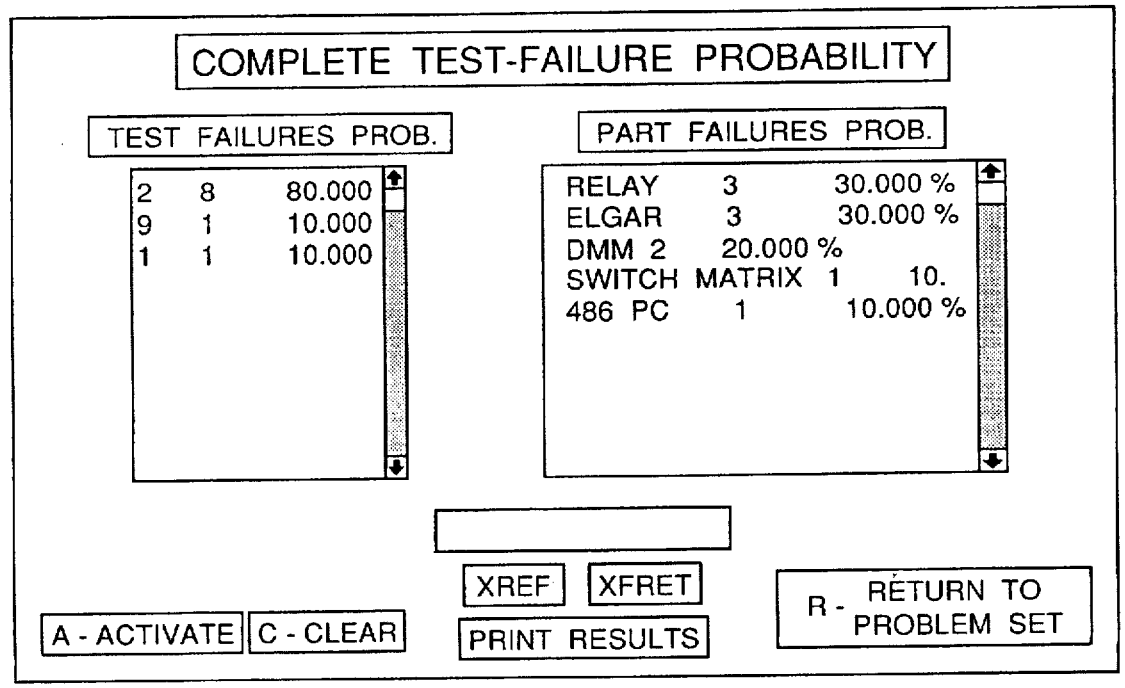
FIG. 9A is the NEUWAA icon screen for complete test failure probability.
Figure 9B:
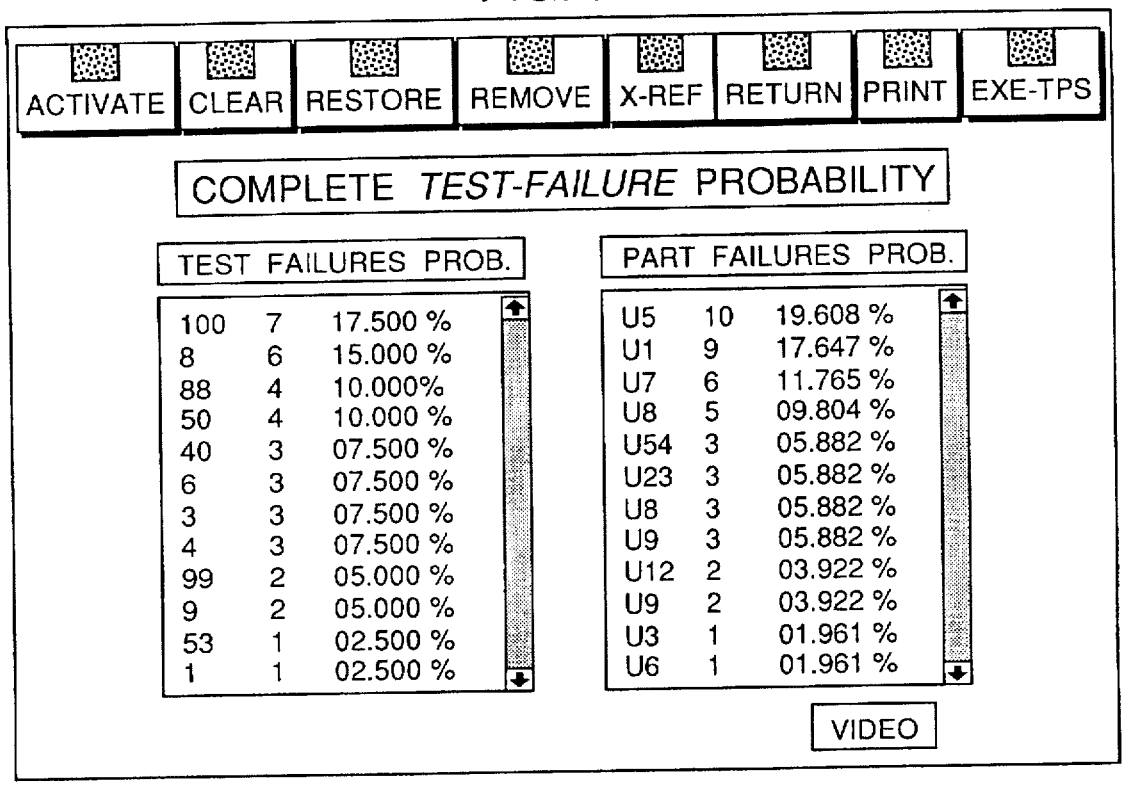
FIG. 9B is the result screen for the option of FIG. 9A.
Figure 10A:
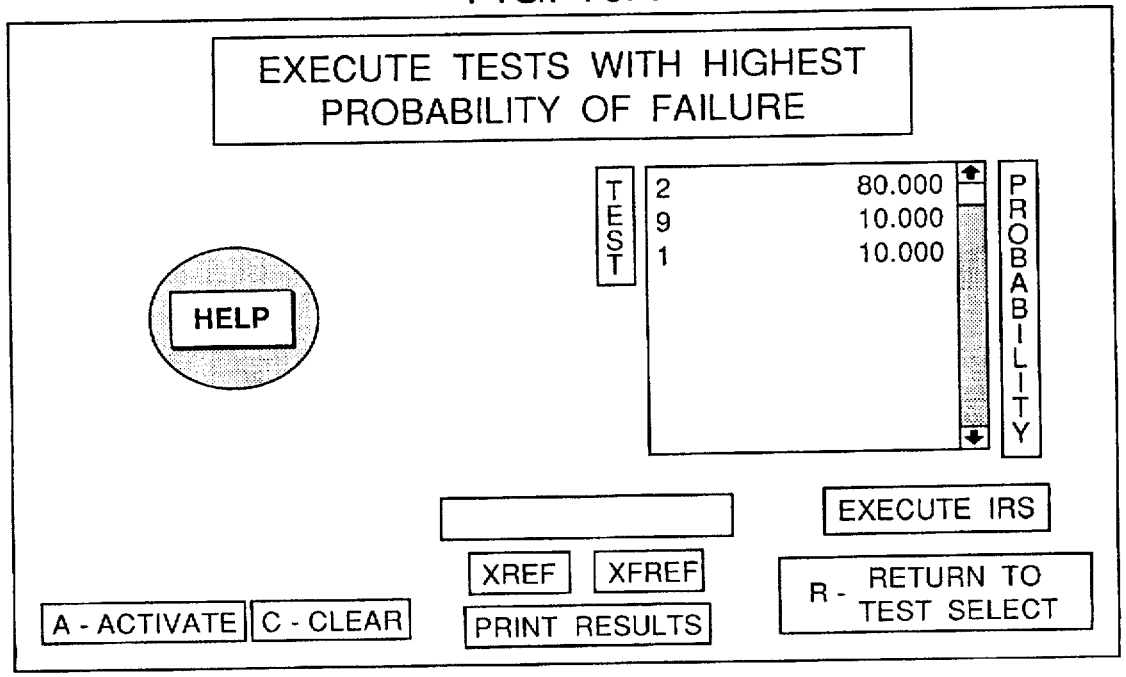
FIG. 10A is the NEUWAA icon screen for executing tests with the highest probability of failure.
Figure 10B:
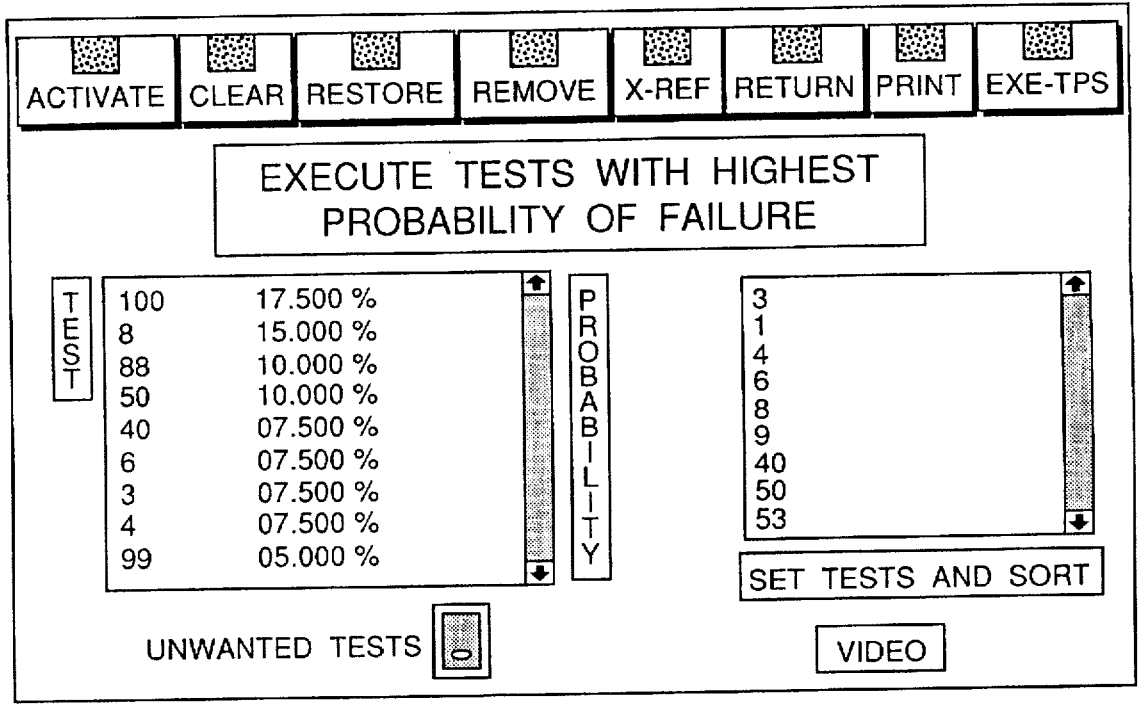
FIG. 10B is the result screen for the option of FIG. 9A.
Figure 11A:
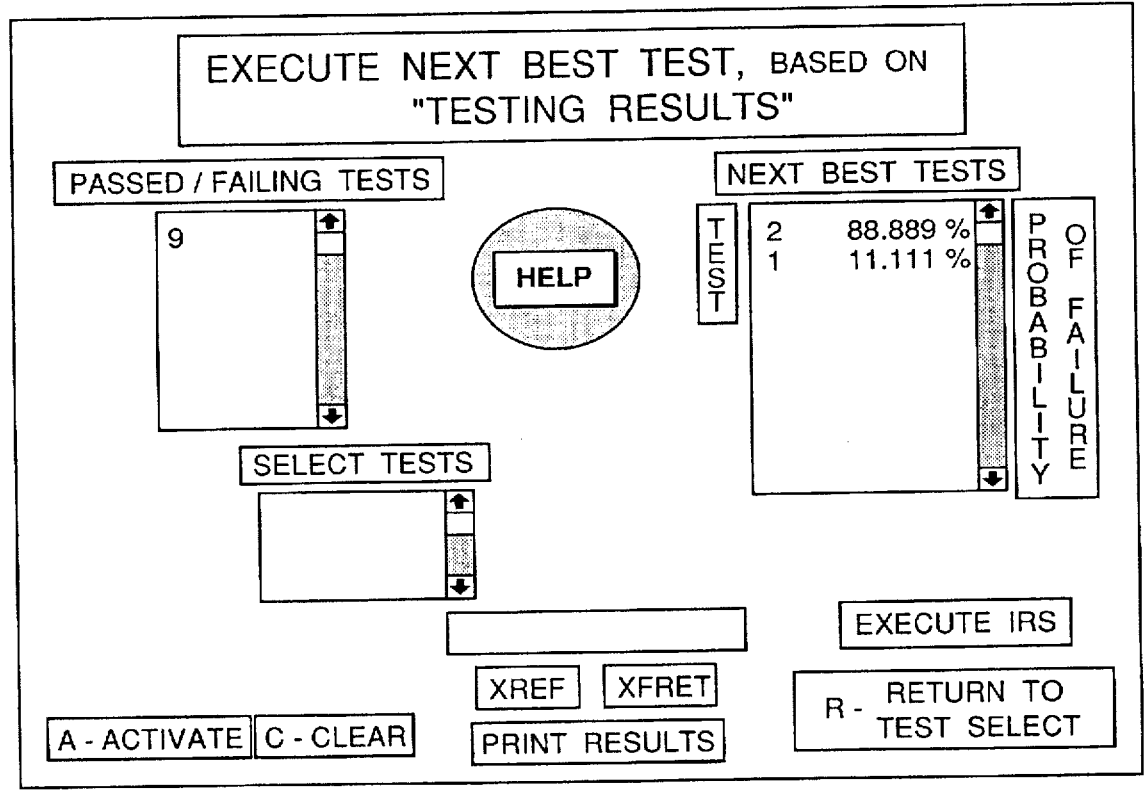
FIG. 11A is the NEUWAA icon screen for executing the next best test based upon testing results.
Figure 11B:
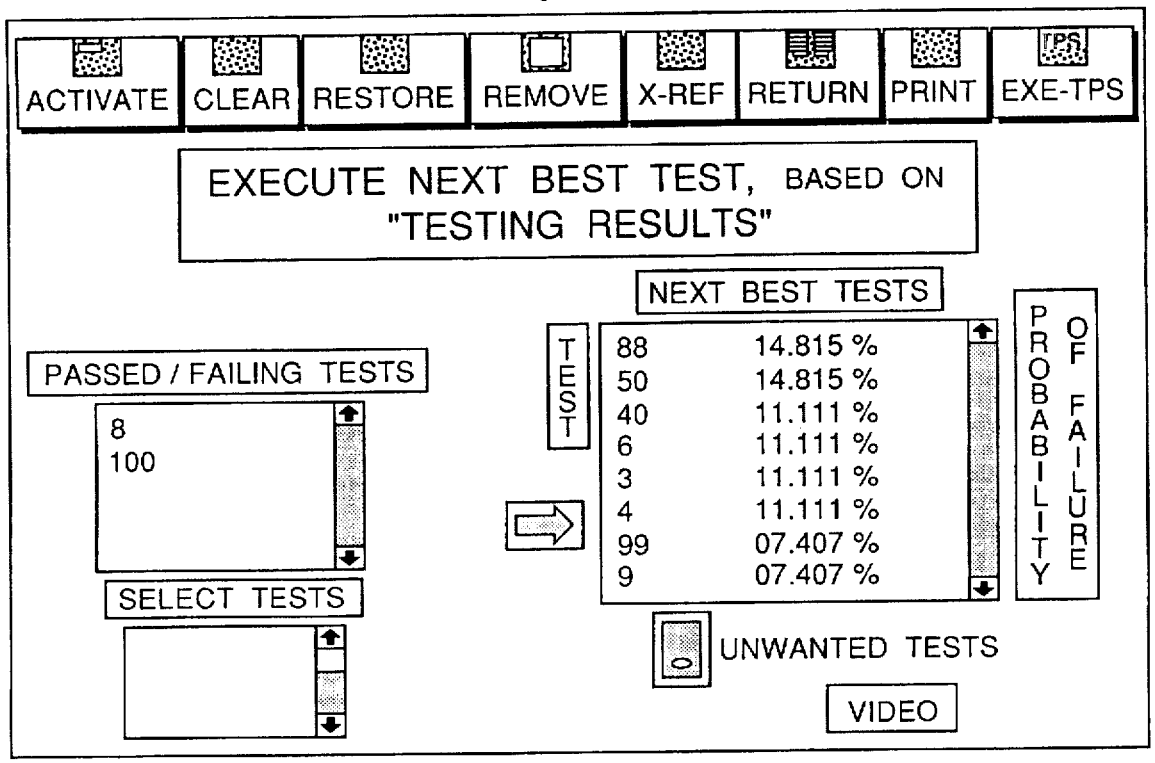
FIG. 11B is the result screen for the option of FIG. 11A.
Figure 12A:
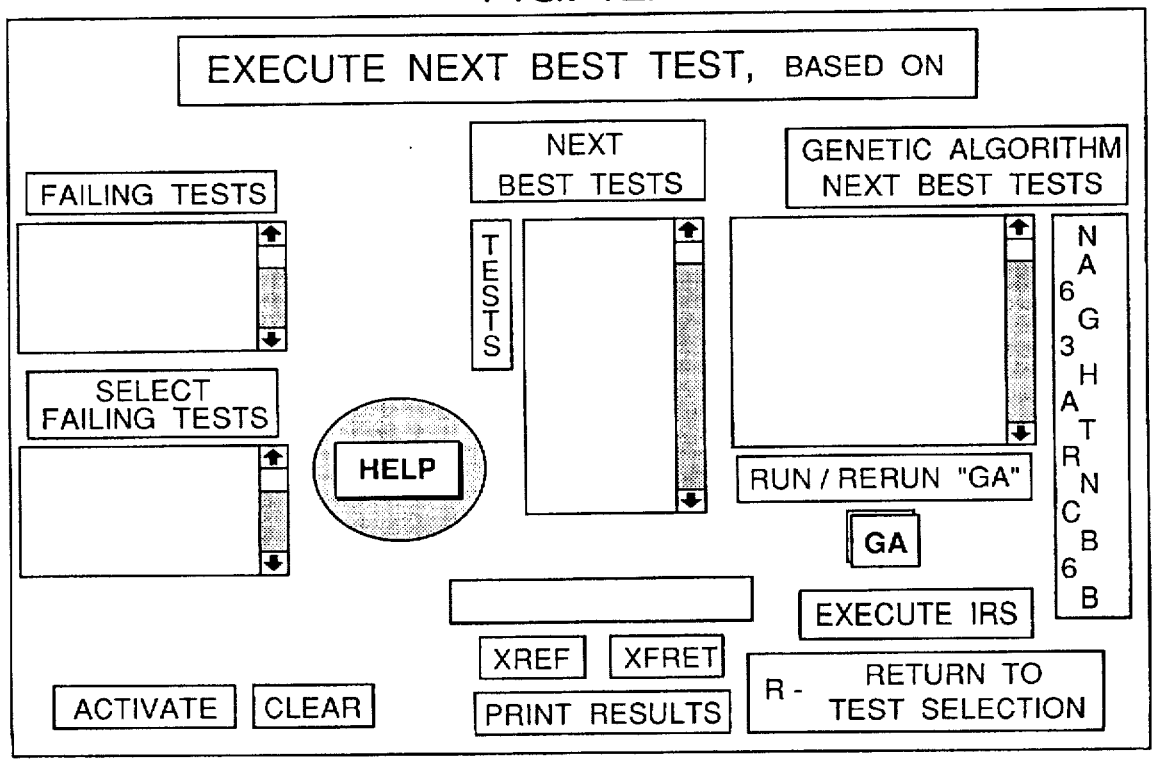
FIG. 12A is the NEUWAA icon screen for the option of executing the next best test for either next best tests, elements failing tests, and genetic algorithm next best test recommendations.
Figure 12B:
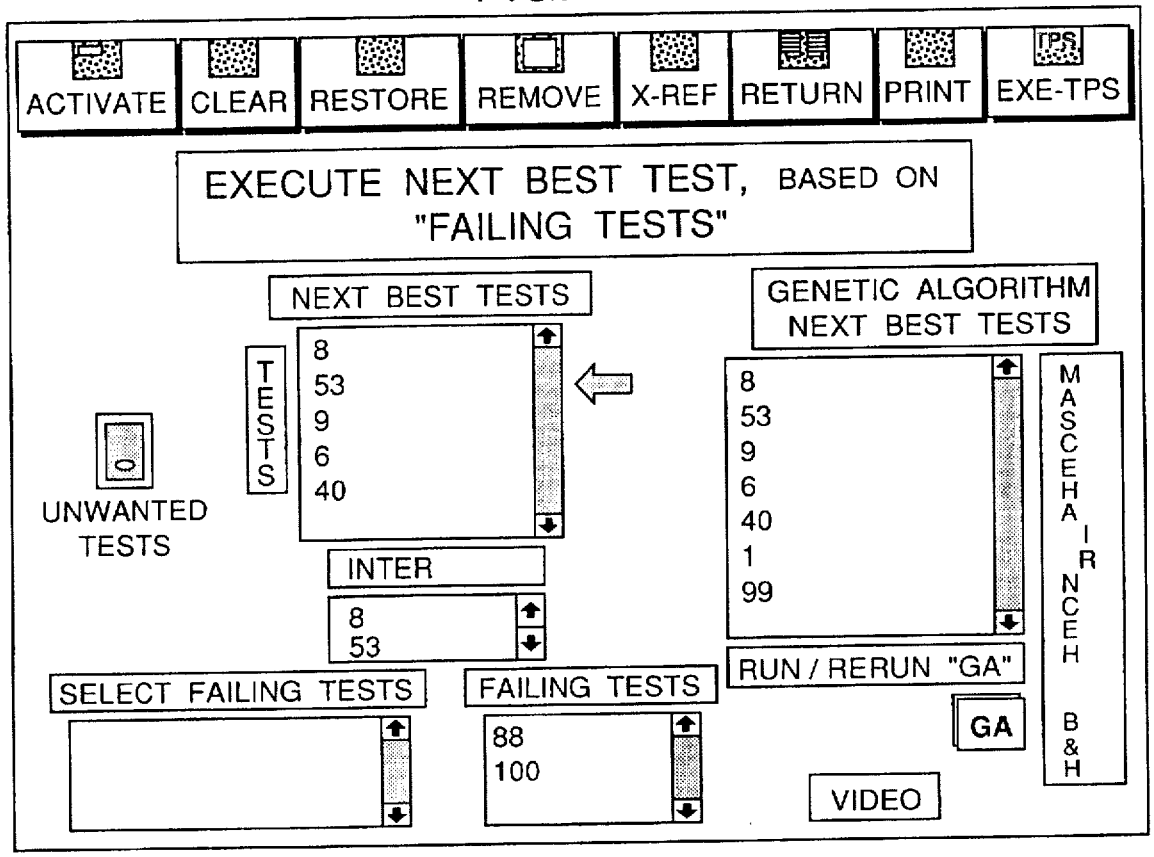
FIG. 12B is an example of a result screen for the option of FIG. 12A.
Figure 13A:
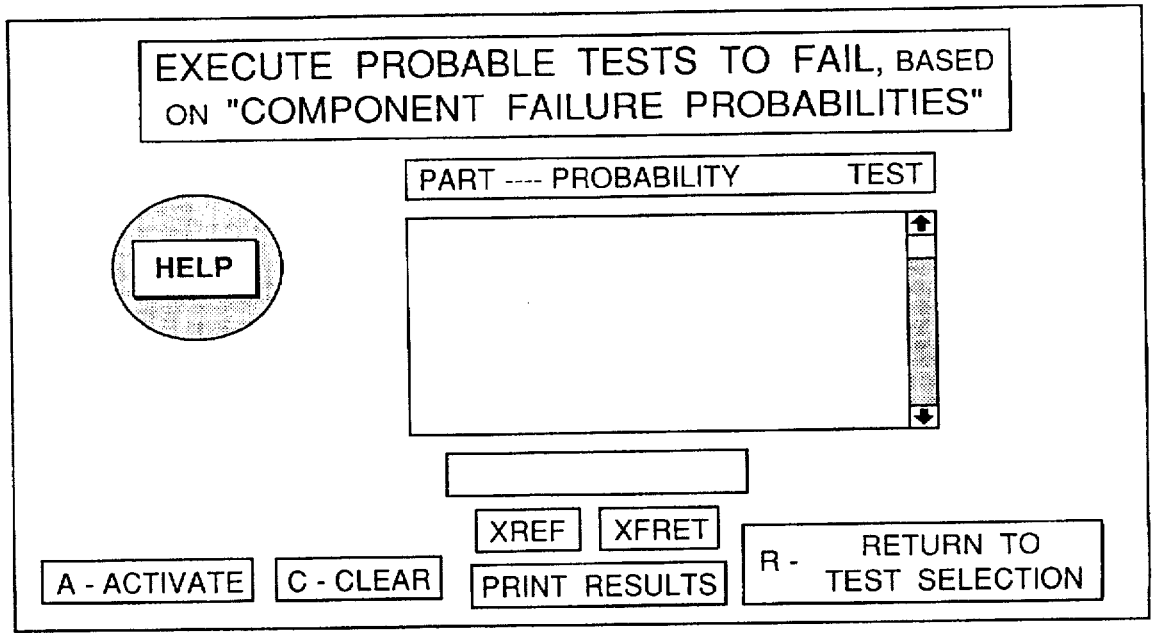
FIG. 13A is the NEUWAA icon screen for executing probable tests to fail based upon component failure probabilities.
Figures 13B, 14A:
FIG. 13B is an example of a result screen for the option of FIG. 13A.
FIG. 14A is the NEUWAA icon screen for executing probable tests to fail based upon a selected reason for repair.
Figure 16A:
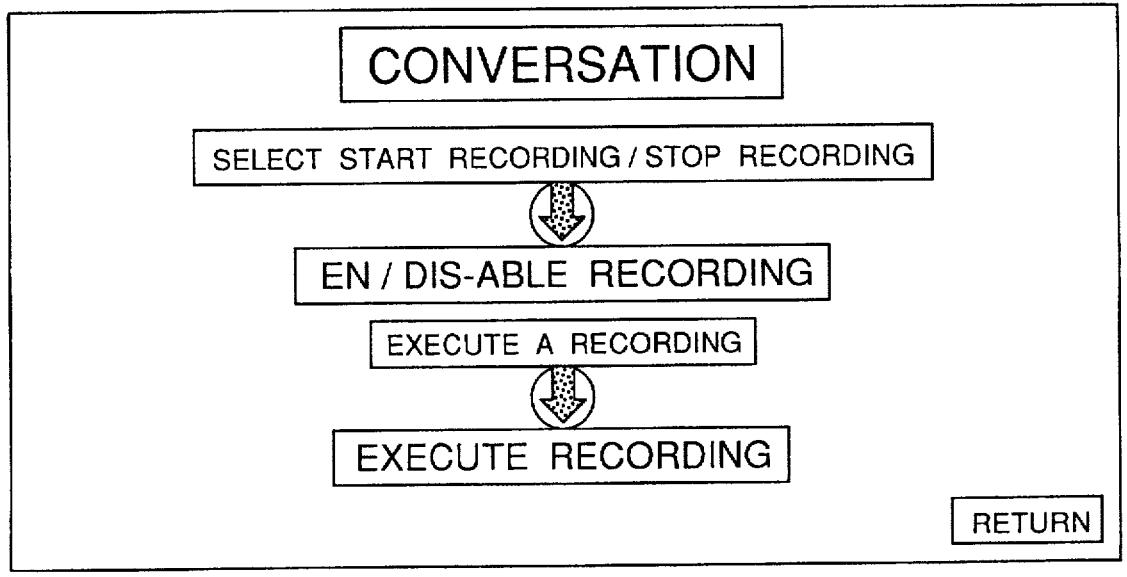
FIG. 16A is the NEUWAA icon screen for the conversation option.
Figure 16B:
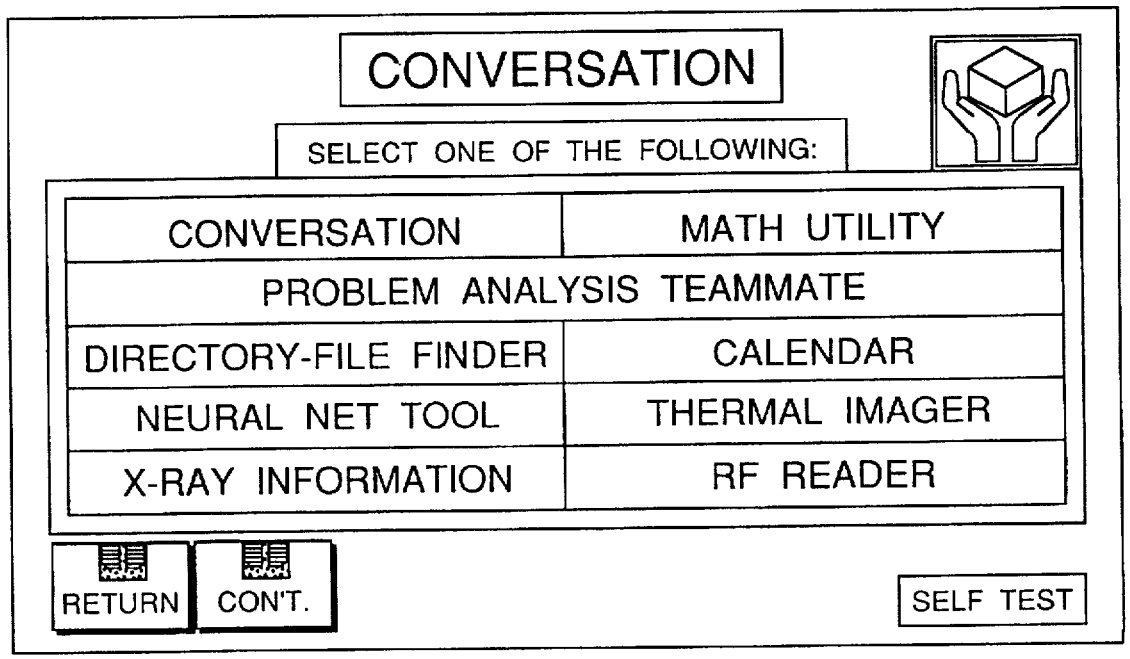
FIGS. 16B and C are the function select screens for the option of FIG. 16A.
Figure 18:
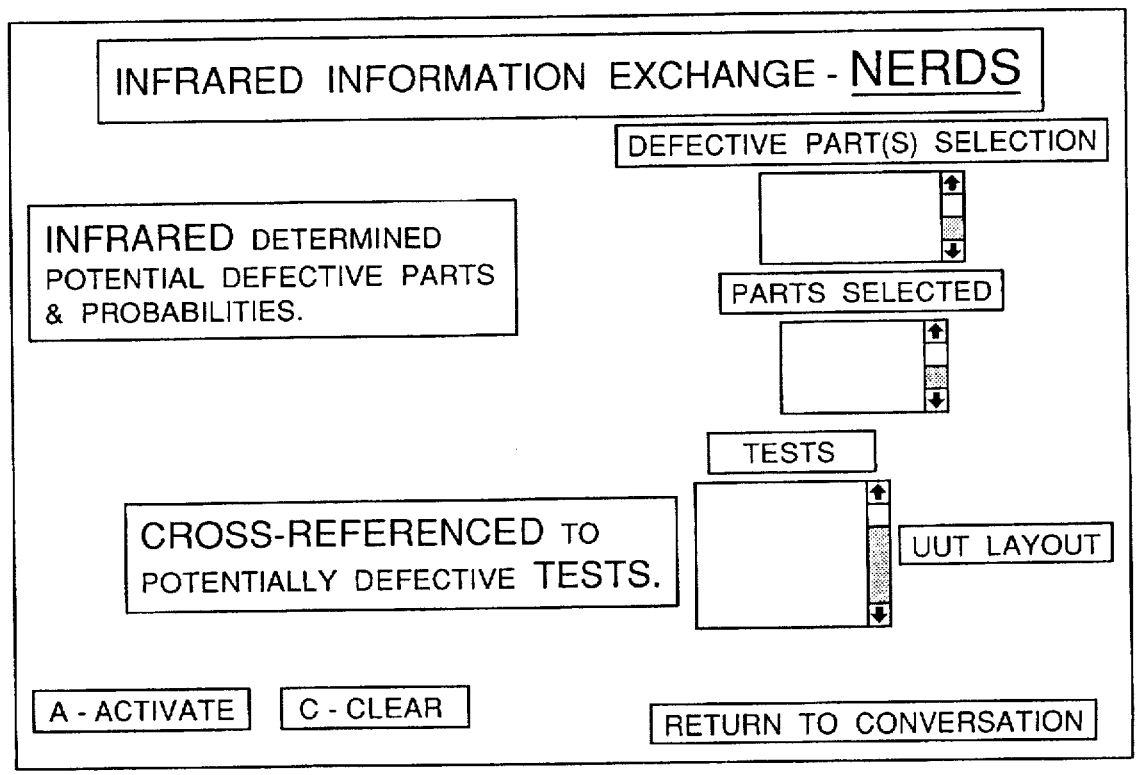
FIG. 18 is the NERDS information exchange screen.
Figure 17A:
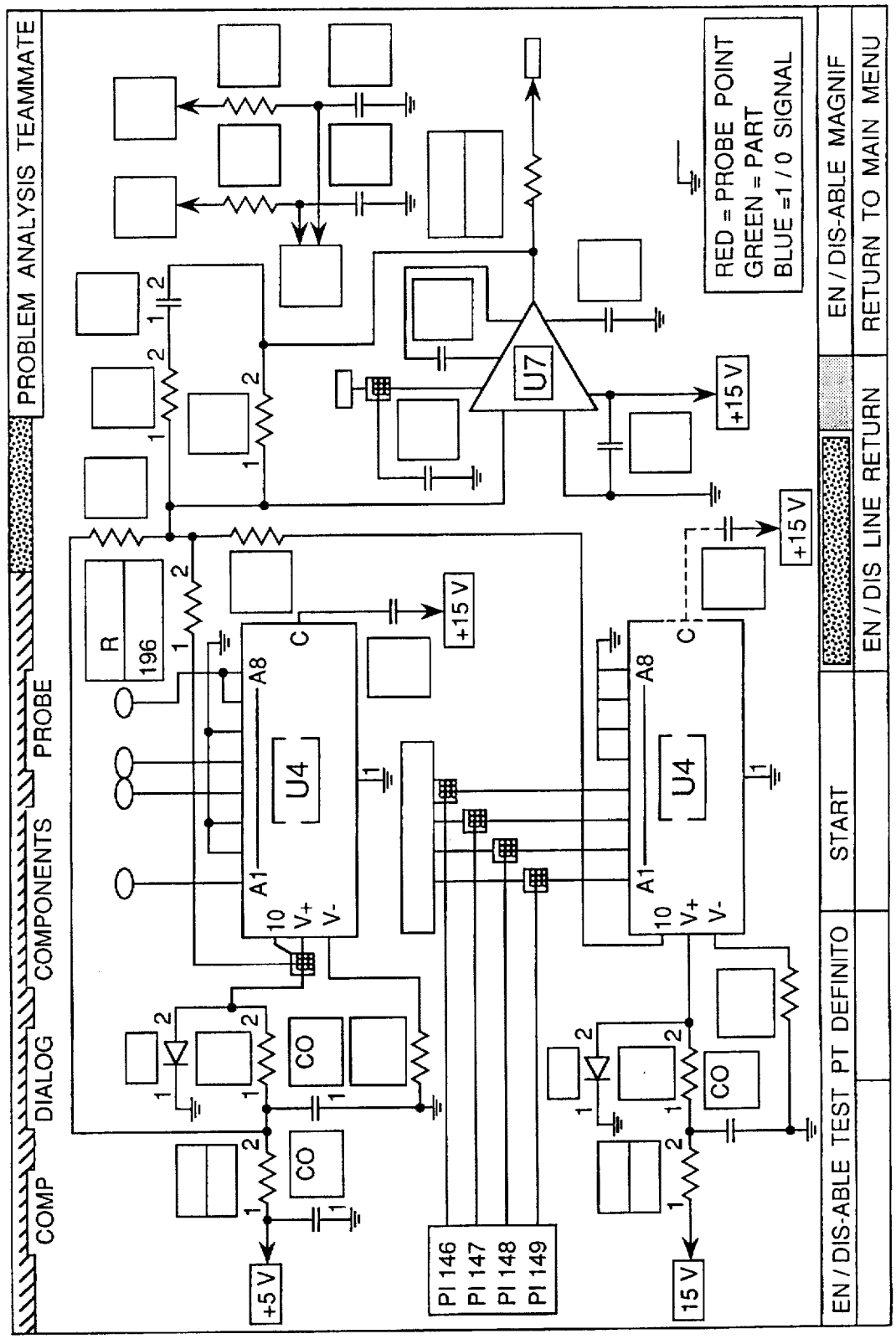
FIG. 17A is an example of a NEUWAA problem analysis screen.
Figure 17B:
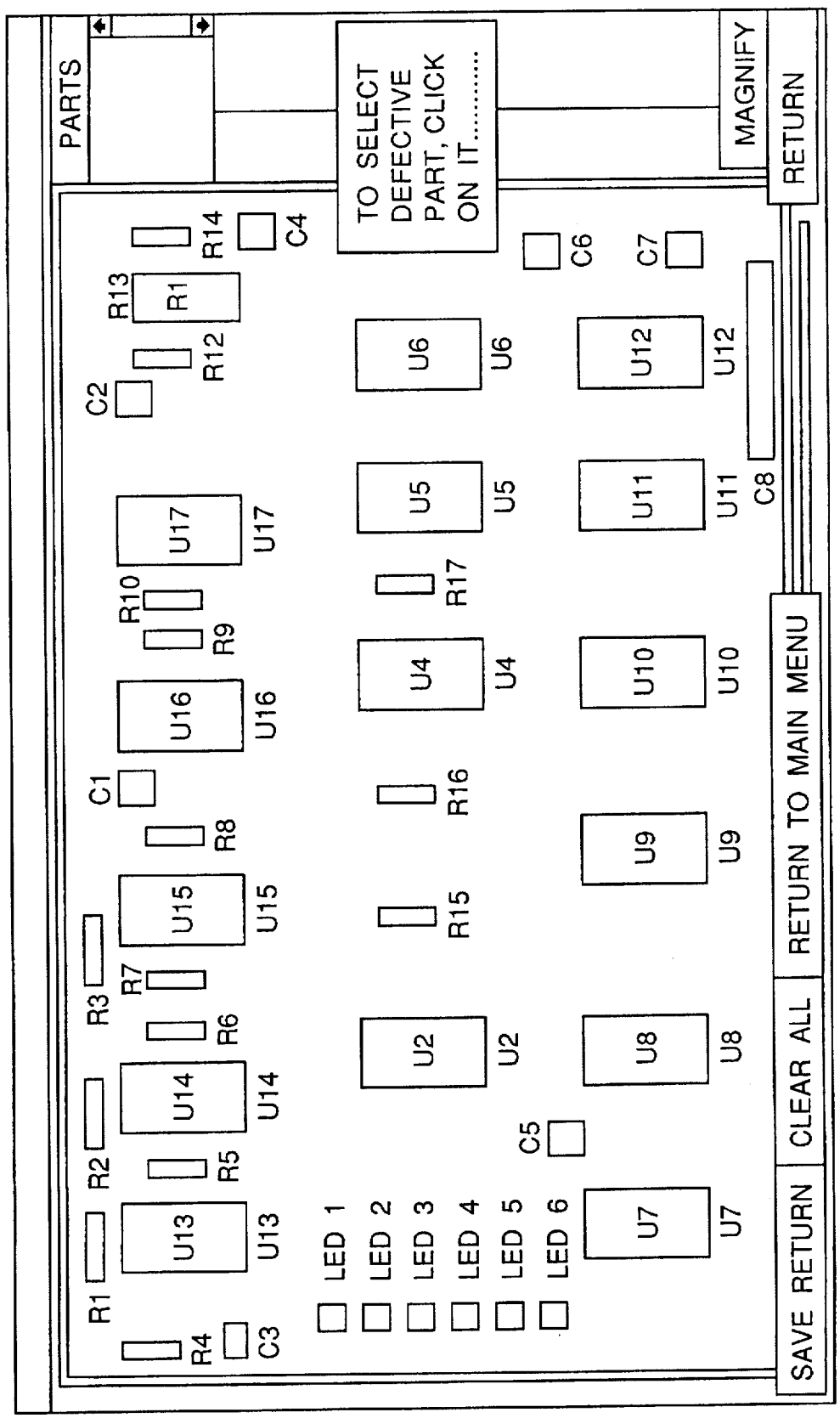
FIG. 17B is an example of a NEUWAA Component identification screen.

FIG. 8A is the NEUWAA icon screen for the "Go to" and "Probable Analysis Team mate" options;

FIG. 8B is a result screen example for a search in a known bad signal path;

FIG. 9A is the NEUWAA icon screen for complete test failure probability;

FIG. 9B is the result screen for the option of FIG. 9A;

FIG. 10A is the NEUWAA icon screen for executing tests with the highest probability of failure;

FIG. 10B is the result screen for the option of FIG. 9A;

FIG. 11A is the NEUWAA icon screen for executing the next best test based upon testing results;

FIG. 11B is the result screen for the option of FIG. 11A;

FIG. 12A is the NEUWAA icon screen for the option of executing the next best test for either next best tests, elements failing tests, and genetic algorithm next best test recommendations;

FIG. 12B is an example of a result screen for the option of FIG. 12A;

FIG. 13A is the NEUWAA icon screen for executing probable tests to fail based upon component failure probabilities;

FIG. 13B is an example of a result screen for the option of FIG. 13A;

FIG. 14A is the NEUWAA icon screen for executing probable tests to fail based upon a selected reason for repair;

FIG. 14B is an example of a screen for the option of FIG. 14A with reasons for repair listed;

FIG. 14C is an example of a results screen for the option of FIG. 14A;

FIG. 15A is the NEUWAA icon screen for identifying component failure probabilities;

FIG. 15B is an example of a result screen for the option of FIG. 15A;

FIG. 16A is the NEUWAA icon screen for the conversation option;

FIGS. 16B and C are the function select screens for the option of FIG. 16A;

FIG. 17A is an example of a NEUWAA problem analysis screen;

FIG. 17B is an example of a NEUWAA Component identification screen;

FIG. 18 is the NERDS information exchange screen; and

Figure 19:
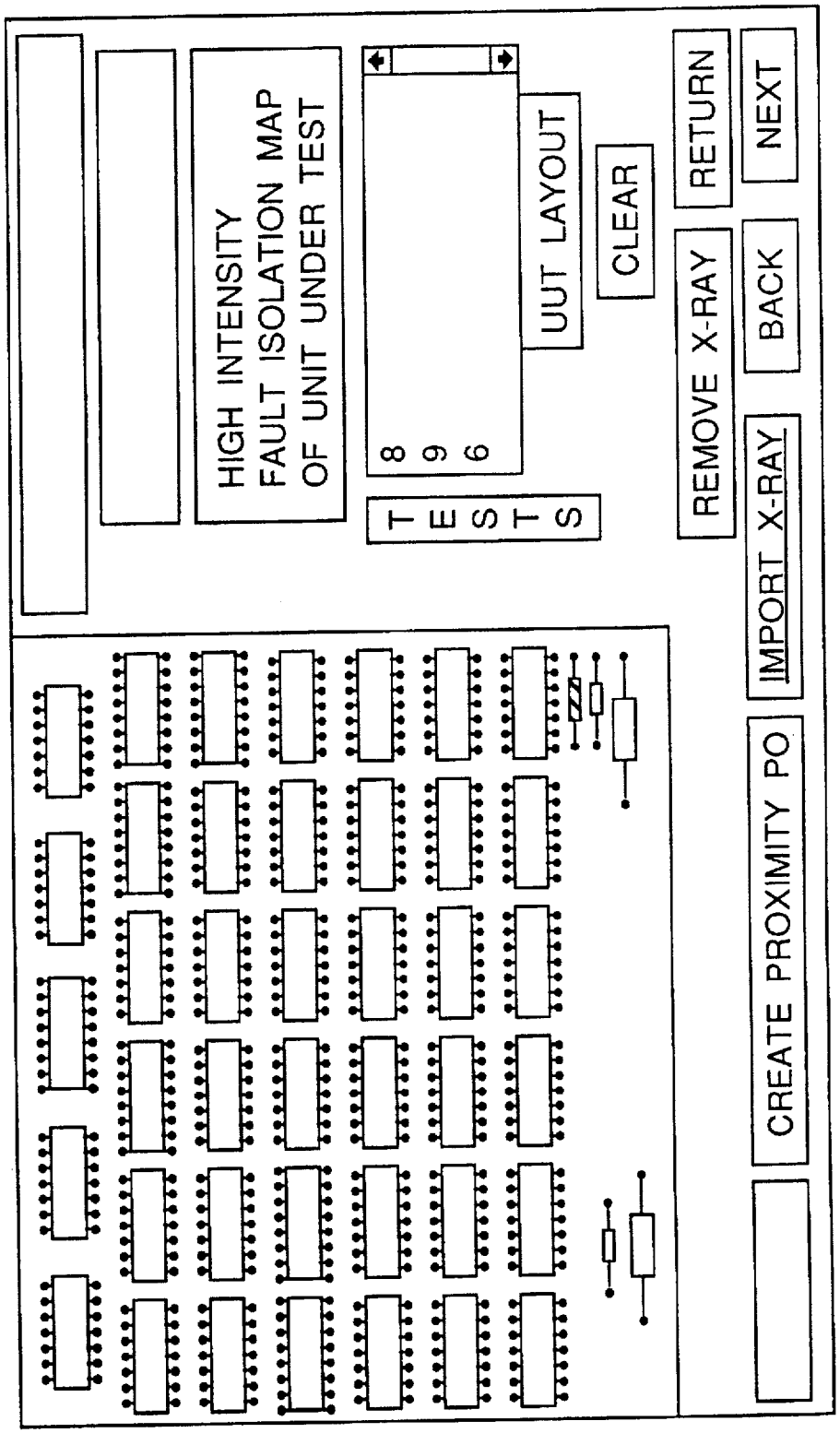
FIG. 19 is an example of a fault isolation map.

FIG. 19 is an example of a fault isolation map.

Table 3 is a list of the six alternatives to sequential test execution a user will encounter. FIG. 10A is the computer display that NEUWAA will present when Option 1 is selected. FIGS. 11A and 12A are the computer displays for option 2 and 3. FIGS. 13A and 14A are the computer displays for option 4 and 5. FIG. 14C is the computer display for Option 6.

Table 4 lists the six alternatives to normal defective part callouts. FIG. 15A is the computer display seen when alternative one is selected. Each of the subsequent screen displays provide more than adequate prompts to enable users to use the system.

Figure 16C:
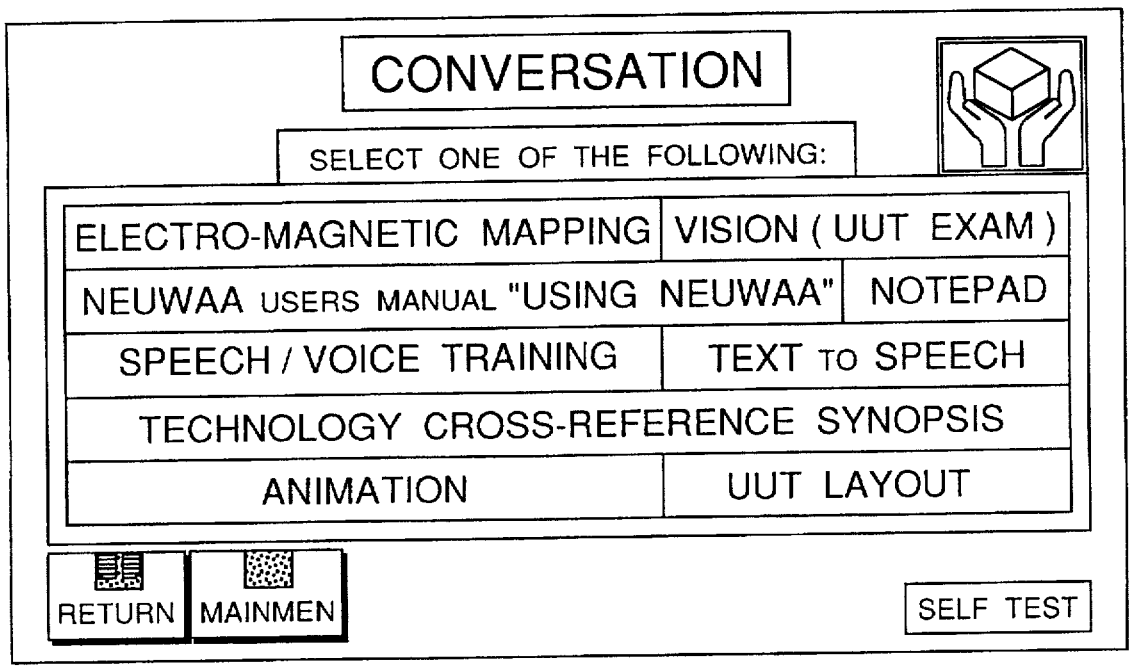

FIGS. 16A–16C are the computer display of NEWWAA's conversation options. Conversation modules provide the link to other technologies, other than Automatic Test Equipment, to enhance the testing environment. Conversation provides the ability to record specific selection sequences for later playback.

As shown in FIG. 17A Problem Analysis Teammate is the active schematic/board layout section. It provides software for Test Point definition, parts definition and Signal Path definition. Components are objects with specific properties when selection. The board layout is shown in FIG. 17A. It provides parts definition.

As shown in FIG. 18, Infrared Information Exchange is the module which cross-references ATE tests and active UUT Layout diagrams to Infrared diagnostic information.

As shown in FIG. 19, X-Ray information exchange is the module which cross-references X-Ray diagnostic information to ATE tests and active UUT Layout diagrams. X-Ray contains a proximity point creation software module for cross-referencing defective parts.

RF Reader is a software module which links the INDALA RF UUT identification chip to NEUWAA. The software reads the stored UUT data information from INDALA's memory. UUT Image is the software module which imports a digitized image of the UUT. UUT layout is the software module which provides object-oriented parts definition and identification.

TABLE 2

SPECIFIC PRE-TEST OPTIONS

NEUWAA

ALGORITHMS (ADAPTABILITY)

1. Test selection based on "Reason for Repair"
2. Tests likely to fail "General"
3. Probable defective components "General"
4. Probable defective components based on "Reason for Repair"
5. Directed search in a known "bad signal path"
6. Complete test failure probability

TABLE 3

ALTERNATIVES TO SEQUENTIAL TEST EXECUTION

NEUWAA

ALGORITHMS

1. Execute tests with highest probability of failure.
2. Execute nextbest test based on "Testing results"
3. Execute nextbest test based on "Failing tests"
4. Execute probable tests to fail, based on "Component failure probabilities"
5. Execute probable tests to fail, based on "Reason for repair"

6. Execute probable tests to fail, based on "Suspected defective components"

TABLE 4

NEUWAA Algorithms (Diagnostics)

ALTERNATIVES TO NORMAL DEFECTIVE PART CALLOUTS

1. Identify component failure probabilities
2. Identify defective parts, based on "Testing results"
3. Identify defective parts, based on "Reason for repair"
4. Identify defective parts, based on "Bad signal path"
5. Identify defective parts at "Any point during testing"
6. Neural Computing for Signal Output While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An artificial intelligence diagnostic and test system which serves as an interface between a set of units under test and automatic test equipment which sends test signals to the units under test, said artificial intelligence diagnostic and test system monitoring reaction signals from said units under test to provide users with adjustable test and diagnostic sequences, said artificial intelligence diagnostic and test system comprising:

a means for selecting test sequences to be performed by said automatic test equipment on said units under test, said selecting means directing said automatic test equipment to send preselected test signals to said units under test on command, a means for diagnosing said reaction signals from said units under test;

a means for providing users with both verbal control and machine message control of test activities, and a means for interpreting alternative test technologies as they interact with said units under test, said alternative test technologies comprising infrared systems, radio frequency detection system and x-ray measurement systems which scan said units under test and provide said interpreting means with indicators of operability that do not require a response to a stimulus by said unit under test.

2. An artificial intelligence diagnostic and test system, as defined in claim 1, which further comprises a means for observing active schematics of said units under test.

3. An artificial intelligence diagnostic and test system, as defined in claim 1, further comprising a means for interacting with any WINDOWS and DOS based computer systems.

4. An artificial intelligence diagnostic and test system, as defined in claim 2, further comprising a means for interacting with any WINDOWS and DOS based computer systems.

5. An artificial intelligence diagnostic and test system, which serves as an interface between a set of units under test and an automatic test equipment which sends test signals to the units under tests, said artificial intelligence and diagnostic test system monitoring reaction signals from said units under tests to provide users with adjustable test and diagnostic sequences, said artificial intelligence diagnostic and test system comprising:

a means for selecting test sequences to be performed by said automatic test equipment on said units under test, said selecting means directing said automatic test equipment to send preselected test signals to said units under test on command;

a means for diagnosing said reaction signals from said units under test; and a means for interpreting alternative test technologies as they interact with said units under test, said alternative test technologies comprising infrared systems, radio frequency detection system and X-ray measurement systems which scan said units under test and provide said interpreting means with indicators of operability that do not require a response to a stimulus by said unit under test.

6. An artificial intelligence diagnostic and test system, as defined in claim 5, further comprising a means for interacting with any WINDOWS and DOS based computer systems.

7. An artificial intelligence diagnostic and test system, as defined in claim 5, further comprising a means for interacting with any WINDOWS and DOS based computer systems.

8. An artificial intelligence diagnostic and test system which serves as an interface between a set of units under test and automatic test equipment which sends test signals to the units under test, said artificial intelligence diagnostic and test system monitoring reaction signals from said units under test to provide users with adjustable test and diagnostic sequences, said artificial intelligence diagnostic and test system comprising:

a means for selecting test sequences to be performed by said automatic test equipment on said units under test, said selecting means directing said automatic test equipment to send preselected test signals to said units under test on command, a means for diagnosing said reaction signals from said units under test:

a means for interacting with any WINDOWS and DOS based computer systems: and a means for interpreting alternative test technologies as they interact with said units under test, said alternative test technologies comprising infrared systems, radio frequency detection system and x-ray measurement systems which scan said units under test and provide said interpreting means with indicators of operability that do not require a response to a stimulus by said unit under test.

* * * * *